US012700449B2

(12) United States Patent
Park et al.

(10) Patent No.: US 12,700,449 B2
(45) Date of Patent: Aug. 4, 2026

(54) SEMICONDUCTOR DEVICE WITH SHARED BIT LINE SENSE AMPLIFIERS

(71) Applicant: SAMSUNG ELECTRONICS CO., LTD., Suwon-si (KR)

(72) Inventors: Keonhee Park, Suwon-si (KR); Suk-Hyun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 18/766,132

(22) Filed: Jul. 8, 2024

(65) Prior Publication Data

US 2025/0210095 A1     Jun. 26, 2025

(30) Foreign Application Priority Data

Dec. 20, 2023    (KR) ........................ 10-2023-0187540

(51) Int. Cl.
G11C 11/40 (2006.01)
G11C 11/408 (2006.01)
G11C 11/4091 (2006.01)
G11C 11/4094 (2006.01)
H10B 12/00 (2023.01)

(52) U.S. Cl.
CPC ...... G11C 11/4091 (2013.01); G11C 11/4085 (2013.01); G11C 11/4094 (2013.01); H10B 12/50 (2023.02)

(58) Field of Classification Search
CPC ............ G11C 11/4091; G11C 11/4085; G11C 11/4094; G11C 11/4097; G11C 11/4063; G11C 7/07; G11C 5/063; G11C 8/14; H10B 12/50
See application file for complete search history.

(56) References Cited

U.S. PATENT DOCUMENTS

| | | | | |
|---|---|---|---|---|
| 9,165,611 B2 * | 10/2015 | Yun | ........................ | G11C 5/063 |
| 9,373,395 B1 * | 6/2016 | Augustine | ........... | G11C 11/1673 |
| 11,195,836 B2 | 12/2021 | Kim et al. | | |
| 11,410,951 B2 | 8/2022 | Choi et al. | | |
| 2016/0163377 A1 * | 6/2016 | Oh | .................... | G11C 11/40615 |
| | | | | 365/222 |
| 2017/0148505 A1 * | 5/2017 | Kwon | .................... | H10D 89/10 |
| 2022/0199621 A1 | 6/2022 | Lee et al. | | |
| 2022/0215863 A1 * | 7/2022 | Chang | .................. | G11C 7/1039 |
| 2022/0216218 A1 | 7/2022 | He et al. | | |
| 2022/0246619 A1 | 8/2022 | Kim | | |
| 2023/0309289 A1 | 9/2023 | Choi et al. | | |
| 2023/0317119 A1 | 10/2023 | Kwon et al. | | |

* cited by examiner

*Primary Examiner* — Khoa D Doan

(74) *Attorney, Agent, or Firm* — Sughrue Mion, PLLC

(57) ABSTRACT

A semiconductor device includes a memory cell array including a plurality of memory cells disposed in a matrix, and a peripheral circuit at least partially overlapping the memory cell array in a first direction and including a plurality of sense amplifiers and a plurality of word line drivers configured to drive the plurality of memory cells. The memory cell array further includes a plurality of bit line pairs and a plurality of word lines coupled with the plurality of memory cells. The plurality of bit line pairs are divided into a plurality of groups. Each group of the plurality of groups includes at least two bit line pairs. The at least two bit line pairs included in a same group of the plurality of groups are coupled with a same sense amplifier of the plurality of sense amplifiers.

18 Claims, 22 Drawing Sheets

<u>Y</u>

SEMICONDUCTOR DEVICE WITH SHARED BIT LINE SENSE AMPLIFIERS

CROSS-REFERENCE TO RELATED APPLICATIONS

This application claims benefit of priority under 35 U.S.C. § 119 to Korean Patent Application No. 10-2023-0187540, filed on Dec. 20, 2023, in the Korean Intellectual Property Office, the disclosure of which is incorporated by reference herein in its entirety.

BACKGROUND

1. Field

The present disclosure relates generally to semiconductor devices, and more particularly, to a three-dimensional (3D) dynamic random access memory (3D-DRAM) device.

2. Description of Related Art

A dynamic random access memory (DRAM) device may refer to a semiconductor memory device that may include, for example, word lines, bit lines, transistors including semiconductor channels, and capacitors. To address an increasing demand on related integrated circuits and electronic devices, an integration level of semiconductor devices may need to be increased. For example, demands on DRAM devices may be addressed by integrating increasing numbers of memory cells, which include the word lines, the bit lines, the transistors, and the capacitors, into the DRAM devices.

Thus, there exists a need for further improvements in semiconductor devices, as the need for increasing integration levels in DRAM devices may be constrained by an ability to efficiently dispose the elements of the DRAM devices. Improvements are presented herein. These improvements may also be applicable to other semiconductor technologies.

SUMMARY

One or more example embodiments of the present disclosure provide a semiconductor device that efficiently arranges a sense amplifier of a semiconductor device.

Further, one or more example embodiments of the present disclosure provide a semiconductor with a reduced delay of a word line driving signal of the semiconductor device, when compared to related semiconductor devices.

Further, one or more example embodiments of the present disclosure provide a semiconductor device that efficiently arranges a word line pad of the semiconductor device.

According to an aspect of the present disclosure, a semiconductor device includes a memory cell array including a plurality of memory cells disposed in a matrix, and a peripheral circuit at least partially overlapping the memory cell array in a first direction and including a plurality of sense amplifiers and a plurality of word line drivers configured to drive the plurality of memory cells. The memory cell array further includes a plurality of bit line pairs and a plurality of word lines coupled with the plurality of memory cells. The plurality of bit line pairs are divided into a plurality of groups. Each group of the plurality of groups includes at least two bit line pairs. The at least two bit line pairs included in a same group of the plurality of groups are coupled with a same sense amplifier of the plurality of sense amplifiers.

According to an aspect of the present disclosure, a semiconductor device includes a memory cell array including a plurality of memory cells disposed in a matrix, and a peripheral circuit at least partially overlapping the memory cell array in a first direction and including a plurality of sense amplifiers and a plurality of word line drivers configured to drive the plurality of memory cells. The memory cell array further includes a plurality of bit line pairs and a plurality of word lines coupled with the plurality of memory cells. The plurality of bit line pairs are coupled with the plurality of sense amplifiers. The plurality of word lines are coupled with the plurality of word line drivers. The peripheral circuit further includes a first region where the plurality of sense amplifiers is disposed and a second region where the plurality of word line drivers is disposed. The second region is disposed at a first side of the first region and at a second side of the first region. The plurality of word line drivers is coupled with first ends of the plurality of word lines and with second ends of the plurality of word lines.

According to an aspect of the present disclosure, a semiconductor device includes a memory cell array including a plurality of memory cells disposed in a matrix, and a peripheral circuit at least partially overlapping the memory cell array in a first direction and including a plurality of sense amplifiers and a plurality of word line drivers configured to drive the plurality of memory cells. The memory cell array further includes a plurality of sub-cell arrays disposed in a second direction orthogonal to the first direction. Each sub-cell array of the plurality of sub-cell arrays includes a plurality of bit lines, a plurality of complementary bit lines extending in the first direction, a plurality of word lines extending in a third direction orthogonal to the first direction and the second direction, and a plurality of contact plugs coupling the plurality of word lines with the plurality of word line drivers. The plurality of word lines are stacked in the first direction. Each word line of the plurality of word lines includes a pad in contact with a contact plug of the plurality of contact plugs. Pads of the plurality of word lines form stairs that extend along the second direction.

According to the embodiment, the semiconductor device may include a memory cell with a 2T-1C structure, and a disposition of the semiconductor device may be efficiently performed by allowing a plurality of bit line pairs to share a sense amplifier.

According to the embodiment, a delay of a word line driving signal may be reduced by disposing word line drivers at both ends of a word line.

According to the embodiment, an area occupied by a word line connection pad may be reduced by disposing the word line connection pad in a stair shape.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION

Figure 1:
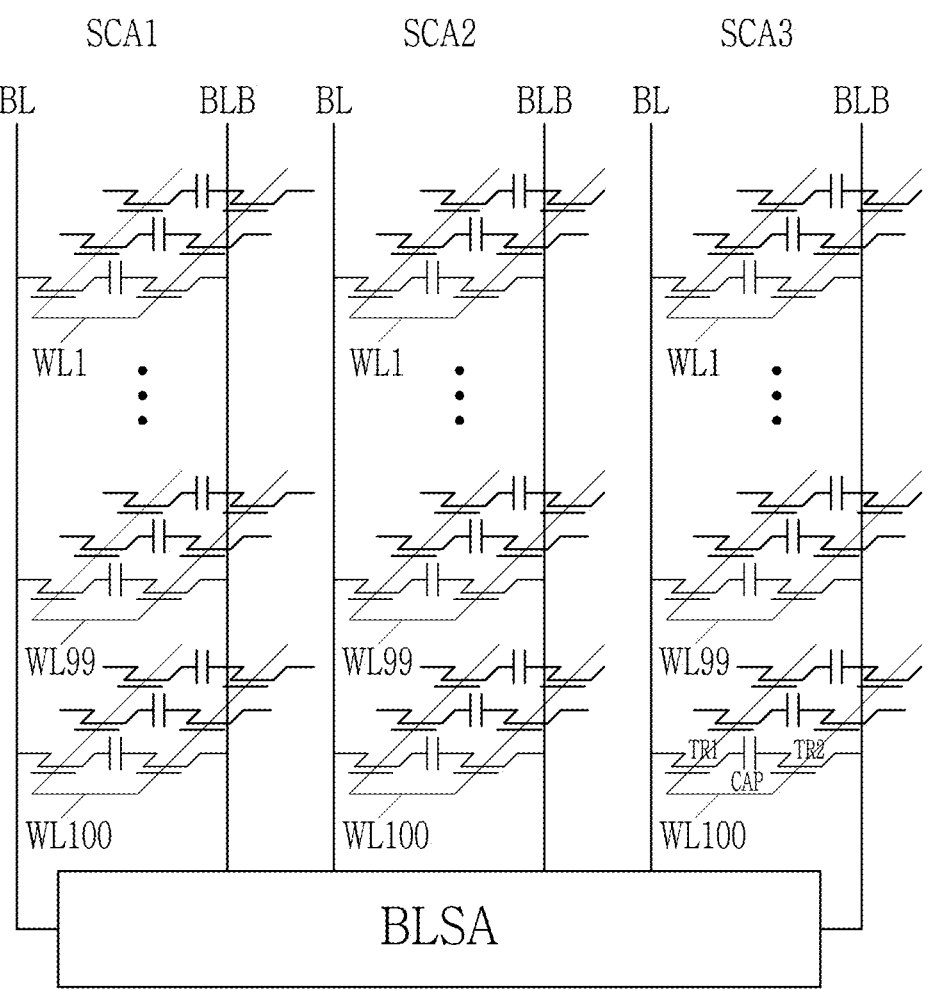
FIG. 1 is an equivalent circuit showing a cell array of a semiconductor device, according to an embodiment.
Figure 1:
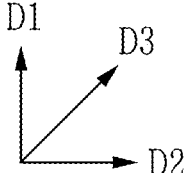

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

The drawings and descriptions are to be regarded as illustrative in nature and not restrictive. Throughout the present disclosure, the same reference numeral may refer to the same constituent element.

Further, the size and thickness of each configuration shown in the drawings may be optionally illustrated for better understanding and ease of description, however, the present disclosure is not limited to the drawings. In the drawings, the thicknesses of a layer, a film, a plate, a region, or the like may be exaggerated for clarity and/or for better understanding and ease of description.

As used herein, the singular forms "a" and "an" are intended to include the plural forms as well, unless the context clearly indicates otherwise.

In the present disclosure, the term "and/or" is intended to include any combination of the terms "and" and "or" for its meaning and interpretation. For example, "A and/or B" may be understood to mean "A, B, or A and B". In addition, each of such phrases as "A or B," "at least one of A and B," "at least one of A or B," "A, B, or C," "at least one of A, B, and C," and "at least one of A, B, or C," may include any possible combination of the items enumerated together in a corresponding one of the phrases.

The phrase "at least one of-" in the present disclosure is intended to include the meaning of "at least one selected from the group of-" for its meaning and interpretation. For example, "at least one of A and B" may be understood to mean "A, B, or A and B".

It is to be understood that although the terms "first" and "second" are used to describe various elements, these elements may not be limited by these terms. These terms are only used to distinguish one element from another element. For example, without departing from the scope of the present disclosure, a first constituent element may be termed as a second constituent element, and similarly, a second constituent element may be termed as a first constituent element.

If an element, such as, but not limited to, a layer, a film, a region or a substrate, is referred to as being "on" another element, the element may be directly on the other element, or an intermediate element may also be present. In contrast, when an element is referred to as being "directly on" another element, there may be no intermediate element. In addition, throughout the present disclosure, the term "above" of the target element may be understood as positioning above or below the target element, and does not necessarily mean positioning "above" with reference to the opposite direction of gravity.

For example, spatially relative terms "below" and "above" may be used to easily describe the relationship between one element or constituent element and another constituent element as shown in the drawings. Spatially relative terms are intended to include other directions in the device being used or operated in addition to the directions shown in the drawings. For example, if the device shown in the drawings is turned over, a device disposed "below" another device may be disposed "above" another device. Accordingly, the term "below" may include both lower and upper positions. A device may also be oriented in different directions, so spatially relative terms may be interpreted differently depending on the direction.

If an element (or a region, a layer, a part, or the like) is referred to as "connected" or "coupled" to another element in the present disclosure, the element may be directly disposed, connected, or coupled to the other element mentioned above, or an element intervening therebetween may be disposed.

The terms "connected to" or "coupled to" may include a physical or electrical connection or coupling.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, may be interpreted as having a meaning that is consistent with their meaning in the context of the relevant art and/or the present disclosure, and may not be interpreted in an idealized or overly formal sense, unless expressly so defined herein.

As used herein, when an element or layer is referred to as "covering", "overlapping", or "surrounding" another element or layer, the element or layer may cover at least a portion of the other element or layer, where the portion may include a fraction of the other element or may include an entirety of the other element. Similarly, when an element or layer is referred to as "penetrating" another element or layer, the element or layer may penetrate at least a portion of the other element or layer, where the portion may include a fraction of the other element or may include an entire dimension (e.g., length, width, depth) of the other element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms.

As used herein, each of the terms "Al$_x$Sn$_y$In$_z$Zn$_a$O$_d$", "Al$_x$Zn$_y$Sn$_z$O$_a$", "GaAs", "GaP", "GaSb", "Ga$_x$Zn$_y$Sn$_z$O$_a$", "Hf$_x$In$_y$Zn$_z$O$_a$", "HfO$_2$", "IGSO", "IGZO", "In$_2$O$_3$", "InGa-SiO", "In$_x$Ga$_y$Zn$_z$O$_a$", "In$_x$Zn$_y$O$_a$", "IZO", "Mg$_x$Zn$_y$O$_z$", "Si$_x$In$_y$Zn$_z$O$_a$" "SiO$_2$" "SnO$_2$", "Sn$_x$In$_y$Zn$_z$O$_a$", "TiO$_x$", "ZnO$_x$", "Zn$_x$O$_y$N$_z$", "Zn$_x$Sn$_y$O$_z$", "Zr$_x$In$_y$Zn$_z$O$_a$", "Zr$_2$", "Zr$_x$Zn$_y$Sn$_z$O$_a$", "ZTO", and the like may refer to a material made of elements included in each of the terms and is not a chemical formula representing a stoichiometric relationship.

Hereinafter, various embodiments of the present disclosure are described with reference to the accompanying drawings.

FIG. 1 is an equivalent circuit showing a cell array of a semiconductor device, according to an embodiment.

Referring to FIG. 1, the cell array of the semiconductor device may include a plurality of sub-cell arrays (e.g., a first sub-cell array SCA1, a second sub-cell array SCA2, and a third sub-cell array SCA3) disposed in a second direction D2, and each of the first to third sub-cell arrays SCA1 to SCA3 may include a plurality of bit lines BL, a plurality of complementary bit lines BLB, a plurality of word lines WL (e.g., a first word line WL1 to a ninety-ninth word line WL99, and a one hundredth word line WL100), and a plurality of memory cells.

Within each of the plurality of sub-cell arrays SCA1 to SCA3, each of the plurality of bit lines BL and each of the plurality of complementary bit lines BLB may be extended in a first direction D1. The plurality of bit lines BL and the plurality of complementary bit lines BLB may be disposed in a row to be spaced apart from each other by a predetermined interval along a third direction D3. In an embodiment, the plurality of bit lines BL and the plurality of complementary bit lines BLB that may be adjacent to each other in the second direction D2 may form a bit line pair.

Within each of the plurality of sub-cell arrays SCA1 to SCA3, the memory cells may be disposed between the plurality of bit lines BL and the plurality of complementary bit lines BLB that form the bit line pair, and the plurality of memory cells spaced apart from each other in the first direction D1 may be disposed in each of the bit line pairs.

In an embodiment, each memory cell may include a first transistor TR1, a second transistor TR2, and a capacitor CAP formed between them. The first transistor TR1 may include a first gate electrode and first and second source/drain layers respectively disposed at both sides thereof, and the second transistor TR2 may include a second gate electrode and first and second source/drain layers respectively disposed at both sides thereof.

The first source/drain layer included in the first transistor TR1 may be electrically connected to the bit line BL, and the second source/drain layer included in the first transistor TR1 may be electrically connected to a first electrode of the capacitor CAP. Additionally, the first source/drain layer included in the second transistor TR2 may be electrically connected to the complementary bit line BLB, and the second source/drain layer included in the second transistor TR2 may be electrically connected to a second electrode of the capacitor CAP.

The memory cell of the semiconductor device may have a 2T-1C structure including two (2) transistors that are the first and second transistors TR1 and TR2 and one (1) capacitor CAP formed between them. However, the present disclosure is not limited in this regard. For example, according to an embodiment, the memory cell of the semiconductor device may have a different dynamic random access memory (DRAM) cell structure such as, but not limited to, a 1T-1C structure.

In an embodiment, first gate electrodes included in a plurality of first transistors TR1 disposed in the same layer along the third direction D3 may be electrically connected to the word line WL formed in the same layer as those of the first gate electrodes and extending in the third direction D3, and second gate electrodes included in a plurality of second transistors TR2 disposed in the layer along the third direction D3 may be electrically connected to the word line WL formed in the same layer as those of the second gate electrodes and extending in the third direction D3.

In an embodiment, the word line WL electrically connected to the first gate electrodes and the word line WL electrically connected to the second gate electrodes may be electrically connected to each other in the same layer. Thus, the first and second gate electrodes formed in the same layer may be electrically connected to the same word line WL.

In an embodiment, the bit line pairs included in the plurality of sub-cell arrays SCA1 to SCA3 may be connected to the same bit line sense amplifier BLSA. That is, one bit line pair included in the first sub-cell array SCA1, one bit line pair included in the second sub-cell array SCA2, and one bit line pair included in the third sub-cell array SCA3 may share one bit line sense amplifier BLSA. The bit lines BL disposed in a row in the second direction D2 and the complementary bit lines BLB disposed in a row in the second direction D2 may be connected to one bit line sense amplifier BLSA.

According to an embodiment, there may be two (2) or four (4) or more bit line pairs sharing one bit line sense amplifier BLSA. That is, bit line pairs of two (2) sub-cell arrays may share one bit line sense amplifier BLSA, and/or bit line pairs of four (4) or more sub-cell arrays may share one bit line sense amplifier BLSA.

If the bit line pairs included in the plurality of sub-cell arrays SCA1 to SCA3 share one bit line sense amplifier BLSA, the number of bit line sense amplifiers BLSA may be reduced so that it is possible to increase a degree of freedom of element disposition of a peripheral circuit portion in which the bit line sense amplifier BLSA, a sub-word line driver SWD, and the like are disposed.

If the memory cell is turned on by a word line WL signal, a power source voltage may be supplied to the complementary bit line BLB and a ground voltage may be supplied to the bit line BL to store an electric charge in the capacitor CAP. When the memory cell is turned on by the word line WL signal, the voltage difference between the bit line BL and the complementary bit line BLB due to the charge stored in the capacitor CAP may be read. Thereafter, if the memory cell is turned on by the word line WL signal, a voltage difference between the bit line BL and the complementary bit line BLB due to the charge stored in the capacitor CAP may be read. In an embodiment, the bit line sense amplifier BLSA may sense (or detect) the voltage difference between the bit line BL and the complementary bit line BLB to amplify the voltage difference.

If the bit line pairs included in the plurality of sub-cell arrays SCA1 to SCA3 share one bit line sense amplifier BLSA, data may be independently stored in each memory cell and data may be independently read from each memory cell by varying an application time of the word line WL signal.

Figure 2:
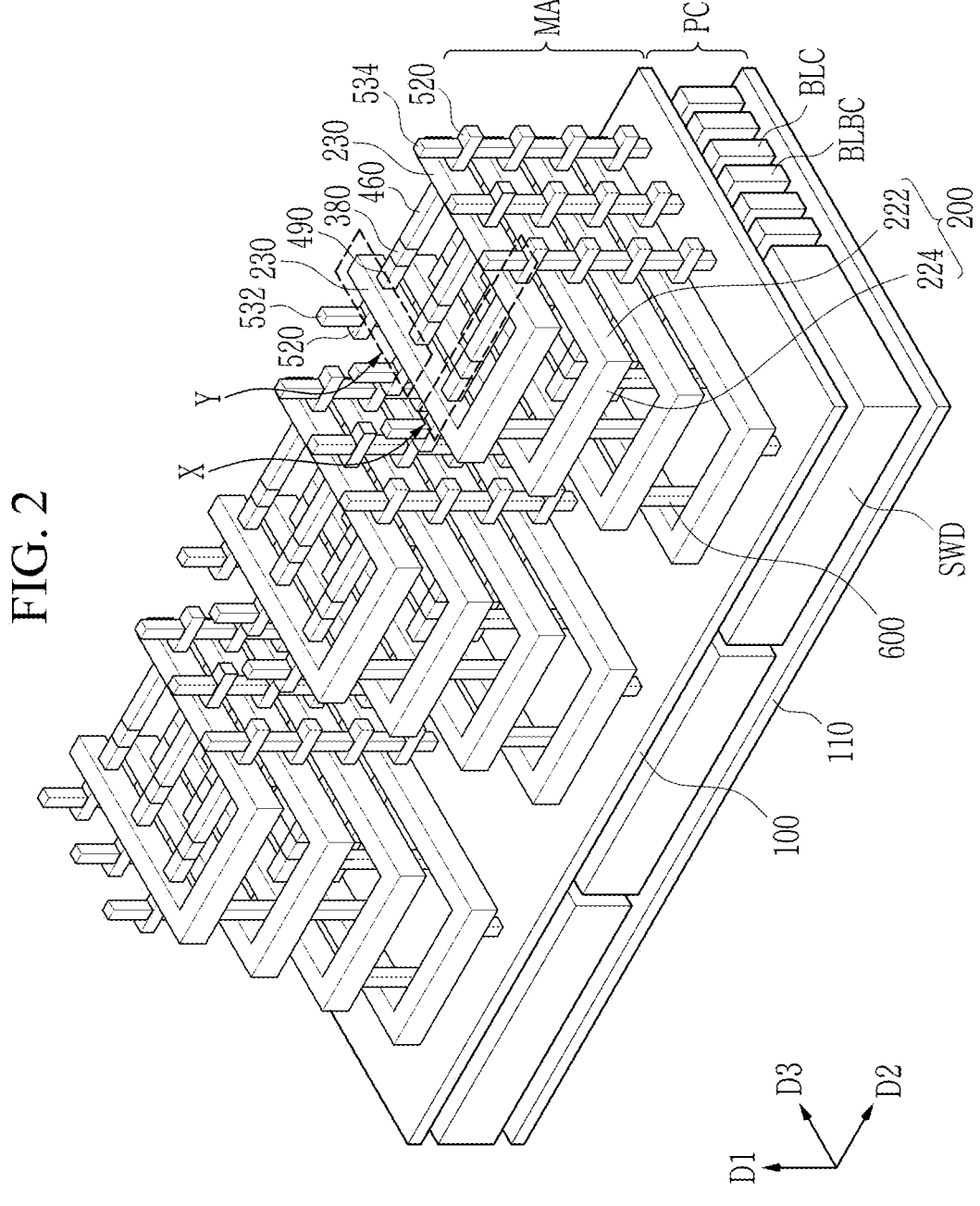
FIG. 2 is a perspective view of the semiconductor device, according to an embodiment.
Figure 3:
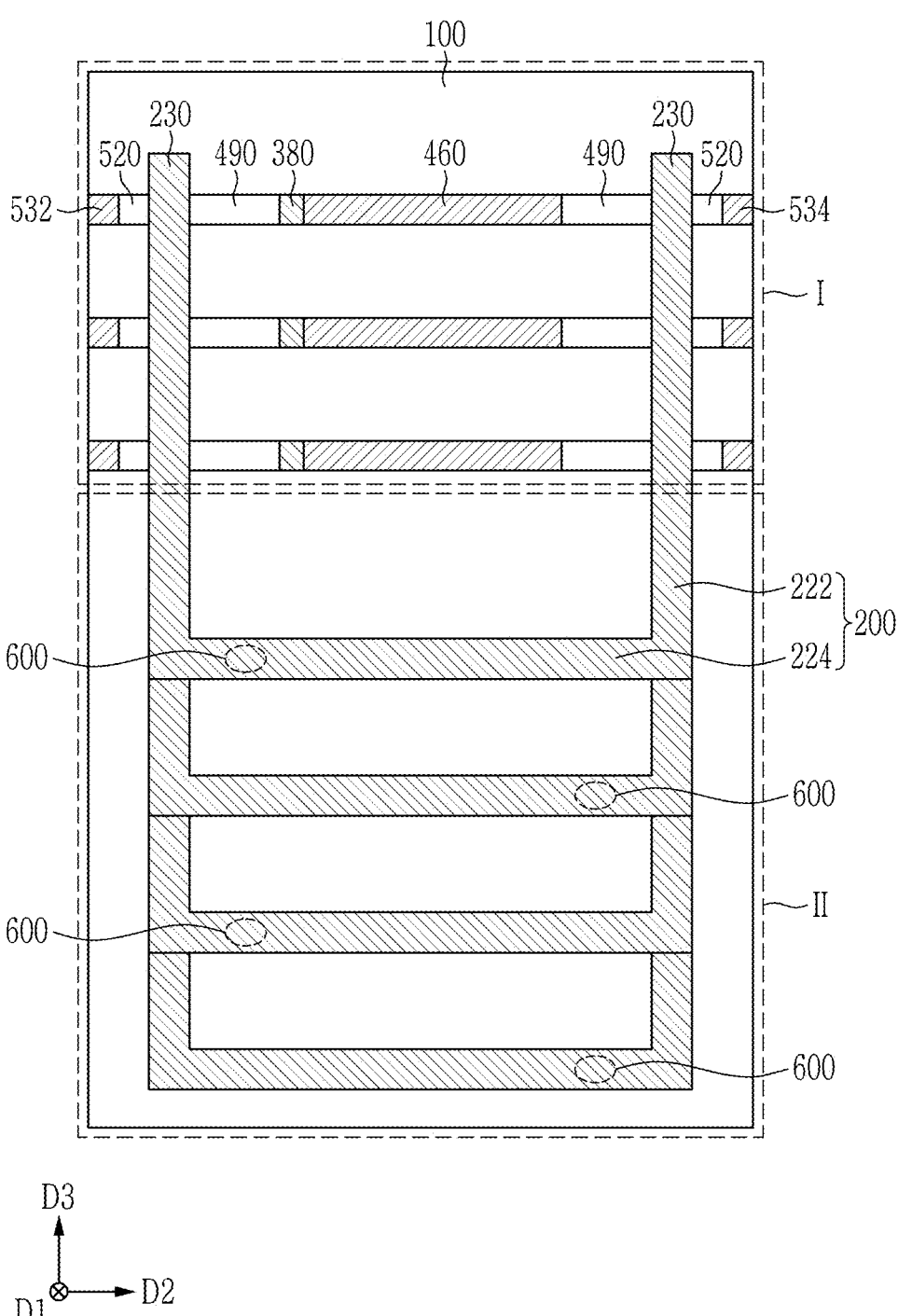
FIG. 3 is an upper side view of the semiconductor device, according to an embodiment.
Figure 4:
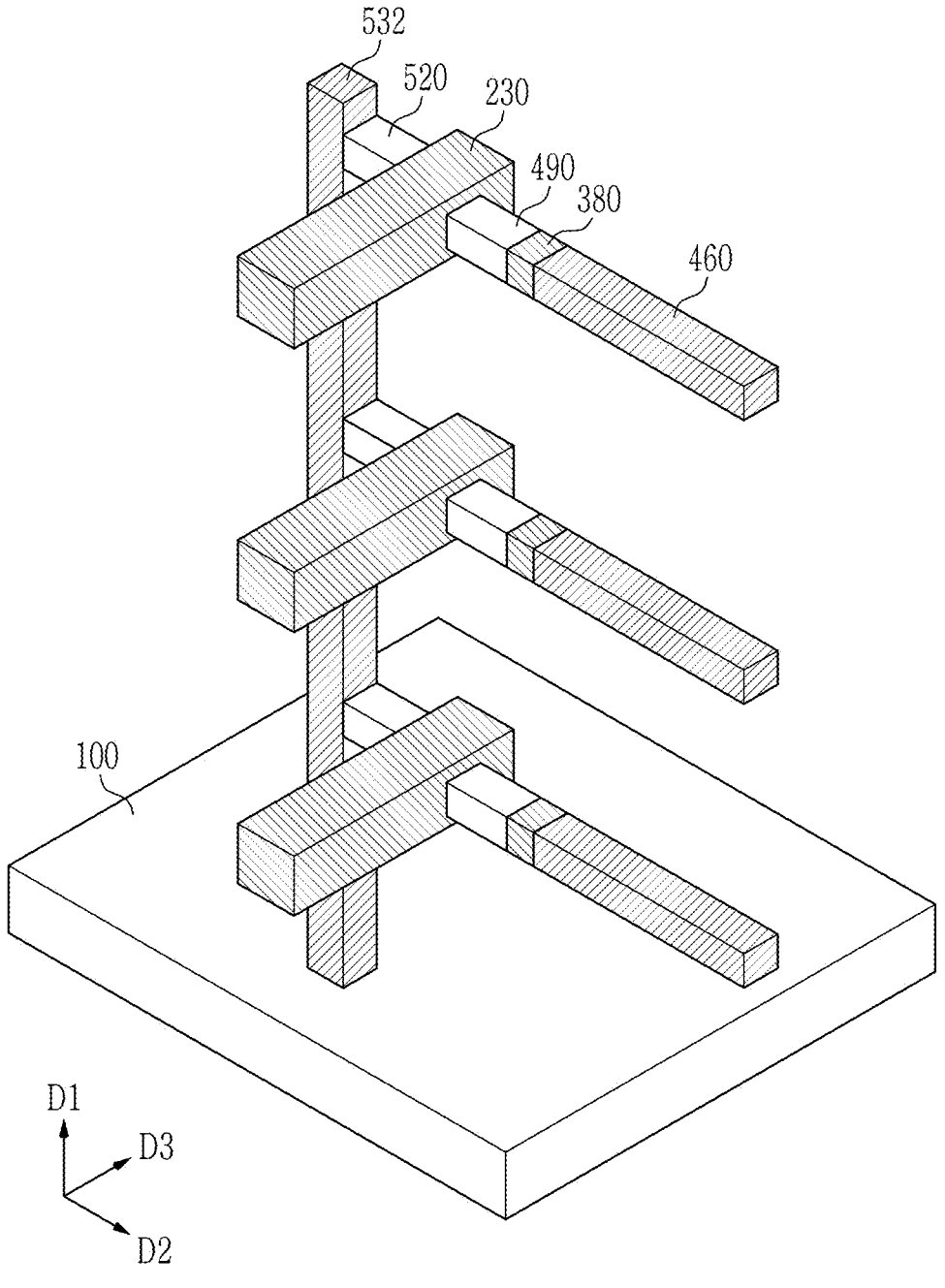
FIG. 4 is a partial perspective view of the semiconductor device, according to an embodiment.
Figure 5:
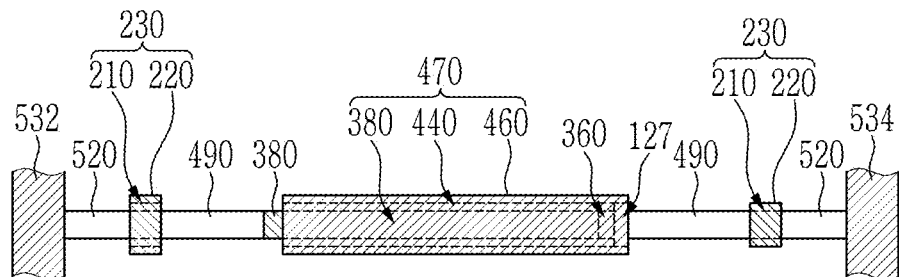
FIG. 5 is a partial side view of a transistor and a capacitor of the semiconductor device, according to an embodiment.
Figure 5:
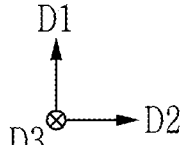
Figure 6:
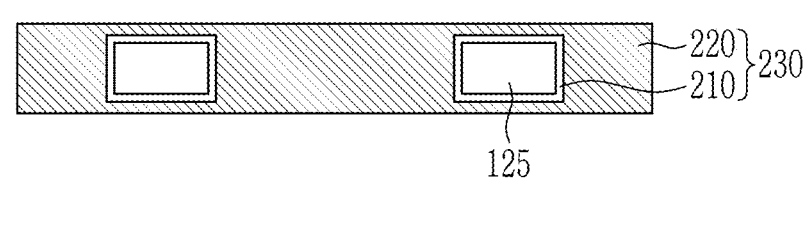
FIG. 6 is a cross-sectional view of a transistor channel portion of the semiconductor device, according to an embodiment.
Figure 6:
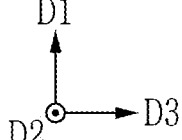
Figure 7:
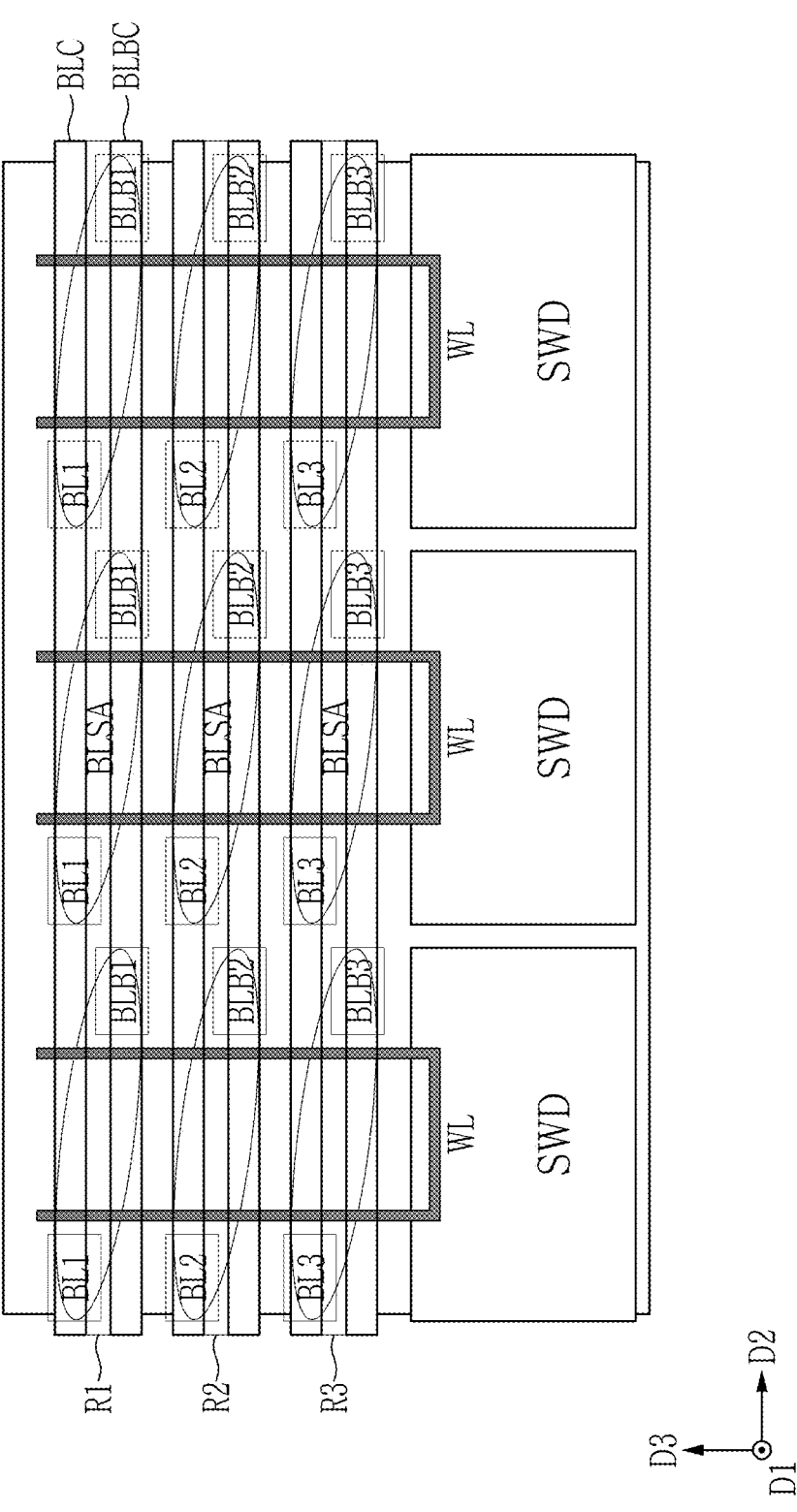
FIG. 7 is a disposition view (or a layout view) of a peripheral circuit portion of the semiconductor device, according to an embodiment.

FIG. 2 is a perspective view of the semiconductor device, according to an embodiment. FIG. 3 is an upper side view of the semiconductor device, according to an embodiment. FIG. 4 is a partial perspective view of the semiconductor device, according to an embodiment. FIG. 5 is a partial side view of a transistor and a capacitor of the semiconductor device, according to an embodiment. FIG. 6 is a cross-sectional view of a transistor channel portion of the semiconductor device, according to an embodiment. FIG. 7 is a disposition view (or a layout view) of a peripheral circuit portion of the semiconductor device, according to an embodiment.

FIGS. 2 to 7 are views corresponding to portions of the plurality of sub-cell arrays SCA1 to SCA3 shown in FIG. 1, from among the semiconductor device.

Referring to FIGS. 2 to 7, the semiconductor device may include a memory cell array portion MA and a peripheral circuit portion PC overlapping in the first direction D1. The memory cell array portion MA may include the memory cells three-dimensionally (3D) disposed above the substrate 100, the bit lines BL 532, the complementary bit lines BLB 534, and gate structures 230. The peripheral circuit portion PC may include the bit line sense amplifier BLSA, a sub-word line driver SWD, the bit line connection line BLC, the complementary bit line connection line BLBC, and the like disposed on the substrate 110. The memory cell array portion MA and the peripheral circuit portion PC may be formed and bonded on separate semiconductor substrates, and/or may be formed by stacking the memory cell array portion MA and the peripheral circuit portion PC on a single semiconductor substrate. In an embodiment, the semiconductor device may have a cell over periphery (COP) structure and/or a periphery over cell (POC) structure.

The memory cell array portion MA may include the gate structure 230, a channel 125, source/drain layers (e.g., a first source/drain layer 520 and a second source/drain layer 490), a capacitor 470, the bit lines BL 532, the complementary bit lines BLB 534, a contact plug 600, a connection pattern 127, and an insulating pattern 360 that may be formed above the substrate 100.

In an embodiment, the memory cell array portion MA may further include an interlayer insulating film formed above the substrate 100 to cover the structures.

For example, the substrate 100 may include a semiconductor material such as, but not limited to, silicon (Si), germanium (Ge), silicon-germanium (Si—Ge), or the like, or a group III-V compound (e.g., gallium phosphide (GaP), gallium arsenide (GaAs), gallium antimonide (GaSb), or the like. According to some embodiments, the substrate 100 may be a silicon-on-insulator (SOI) substrate and/or a germanium-on-insulator (GOI) substrate.

The substrate 100 may include a first region I and a second region II. In an embodiment, the first region I may be and/or may include a cell region where the memory cells are formed, and the second region II may be and/or may include an extension region where contact plugs 600 for transmitting electric signals to the memory cells are disposed. In an embodiment, the second region II may be formed at one side of the first region I in the third direction D3. According to an embodiment, the second region II may be formed at both sides of the first region I in the third direction D3, and/or may surround the first region I.

The bit lines BL 532 and the complementary bit lines BLB 534 may be formed above the first region I of the substrate 100 to extend in first direction D1. Each of the bit lines BL 532 and each of the complementary bit lines BLB 534 may be disposed to be spaced apart from each other along the third direction D3 to form a bit line row and a complementary bit line row. The bit lines BL 532 and the complementary bit lines BLB 534 may be alternately disposed in the second direction D2. In an embodiment, the bit line BL 532 and the complementary bit line BLB 534 that may be disposed adjacent to each other in the second direction D2 may form a bit line pair. The bit line BL 532 and the complementary bit line BLB 534 forming one bit line pair may be spaced apart from each other in the second direction D2, and may also be spaced apart from each other in the third direction D3. That is, the bit lines BL 532 and the complementary bit lines BLB 534 may not be disposed on the same straight line in the second direction D2. The bit line row in which the bit lines BL 532 are disposed in a row in the second direction D2 and the complementary bit line row in which the complementary bit lines BLB 534 are disposed in a row in the second direction D2 may be disposed on a straight line parallel to each other. Accordingly, one bit line sense amplifier BLSA may be shared by a plurality of bit line pairs. That is, the bit lines BL 532 disposed in a row in the second direction D2 may be connected to the same bit line connection line BLC to become one bit line sense amplifier BLSA, and the complementary bit lines BLB 534 disposed in a row in the second direction D2 may be connected to the same complementary bit line connection line BLBC to become one bit line sense amplifier BLSA.

The plurality of bit line pairs spaced apart from each other in the third direction D3 may be included. The bit line pairs spaced apart from each other in the third direction D3 may be connected to different bit line sense amplifiers BLSA.

For example, upper surfaces of the bit lines BL 532 and the complementary bit lines BLB 534 may have a shape such as, but not limited to, a polygon, a polygon with rounded corners, a circle, an ellipse, or the like.

The memory cell extending in a direction including both the second direction D2 and the third direction D3 may be connected between the bit lines BL 532 and the complementary bit lines BLB 534. In an embodiment, the memory cell may include the capacitor 470, a first transistor formed between the capacitor 470 and the bit line BL 532, and a second transistor formed between the capacitor 470 and the complementary bit line BLB 534. In such an embodiment, each of the first and second transistors may include the second source/drain layer 490, the channel 125, and the second source/drain layer 490 sequentially disposed between the capacitor 470 and each of the bit lines BL 532 and the complementary bit lines BLB 534, and the gate structure 230 surrounding the channel 125.

In an embodiment, the plurality of memory cells spaced apart from each other along the first direction D1 may be disposed between the bit line pairs. Additionally, because a plurality of the bit line pairs are disposed to be spaced apart from each other along the third direction D3, the plurality of the memory cells may also be disposed to be spaced apart from each other along the third direction D3. In the drawings, as an example, three (3) memory cells spaced apart from each other in the third direction D3 are shown in each of four (4) layers spaced apart from each other along the first direction D1 above the substrate 100, however, the present disclosure is not limited thereto, and more memory cells than three (3) memory cells may be formed in more than each of the four (4) layers.

In an embodiment, the capacitor 470 may include a first capacitor electrode 380 with a pillar shape extending in the second direction D2, a dielectric pattern 440 having a cylinder shape with an empty center surrounding and covering surfaces (e.g., upper and lower surfaces) and both sidewalls in the third direction D3 of the first capacitor electrode 380, and a second capacitor electrode 460 having a cylinder shape with an empty center surrounding and covering surfaces (e.g., upper and lower surfaces) and both outer sidewalls in the third direction D3 of the dielectric pattern 440. However, the present disclosure is not limited thereto, and for example, the first capacitor electrode 380 may have a cylinder shape with an empty center instead of a pillar shape, and the second capacitor electrode 460 may have a pillar shape instead of a cylinder shape with an empty center.

In an embodiment, the dielectric pattern 440 may not cover the surfaces (e.g., the upper and lower surfaces) and the both sidewalls in the third direction D3 of the first capacitor electrode 380.

In an embodiment, a cross-section vertical to the second direction D2 of the first capacitor electrode 380 may be a quadrangle. However, the present disclosure is not limited thereto, and for example, the cross-section vertical to the second direction D2 of the first capacitor electrode 380 may have a shape other than a quadrangle, such as, but not limited to, a polygon, a polygon with rounded corners, a circle, an ellipse, or the like.

In an embodiment, one sidewall of the first capacitor electrode 380 in the second direction D2 may be in contact with and be electrically connected to a sidewall of the second source/drain layer 490 included in the first transistor in the second direction D2, but the other sidewall of the first capacitor electrode 380 in the second direction D2 may not be in contact with a sidewall of the second source/drain layer 490 included in the second transistor in the second direction D2.

In an embodiment, the insulating pattern 360 and the connection pattern 127 may be sequentially disposed along the second direction D2 between the other sidewall of the first capacitor electrode 380 in the second direction D2 and the sidewall of the second source/drain layer 490 included in the second transistor in the second direction D2 to contact them. Each of the insulating pattern 360 and the connection pattern 127 may have a pillar shape extending in the second direction D2 similar to that of the first capacitor electrode 380. However, a length of each of the insulating pattern 360 and the connection pattern 127 along the second direction D2 may be smaller than the length of the first capacitor electrode 380.

A cross-section vertical to the second direction D2 of each of the insulating pattern 360 and the connection pattern 127 may have a substantially similar and/or the same shape as the shape of the cross-section vertical to the second direction D2 of the first capacitor electrode 380. In an embodiment, thicknesses and widths of the insulating pattern 360 along the first and third directions D1 and D3 may be substantially similar and/or the same as thicknesses and widths of the first capacitor electrode 380 along the first and third directions D1 and D3, respectively, and thicknesses and widths of the connection pattern 127 along the first and third directions D1 and D3 may be substantially similar and/or the same as thicknesses and widths of a structure including the first capacitor electrode 380 and the dielectric pattern 440 along the first and third directions D1 and D3, respectively. However, the present disclosure is not limited thereto.

The insulating pattern 360 may include an insulating material. The connection pattern 127 may include a semiconductor material doped with an n-type or p-type impurity (e.g., silicon (Si) or silicon-germanium (Si—Ge) doped with an n-type or p-type impurity). Alternatively or additionally, the connection pattern 127 may include an oxide semiconductor material doped with an n-type or p-type impurity (e.g., indium gallium zinc oxide (IGZO)).

Because the insulating pattern 360 may be disposed between the other sidewall of the first capacitor electrode 380 in the second direction D2 and the sidewall of the second source/drain layer 490 included in the second transistor in the second direction D2, the first capacitor electrode 380 may not be electrically connected to the second source/drain layer 490 included in the second transistor.

The dielectric pattern 440 may cover not only the upper and lower surfaces and both sidewalls in the third direction D3 of the first capacitor electrode 380 but also surfaces (e.g., upper and lower surfaces) and both sidewalls in the third direction D3 of the insulating pattern 360.

The second capacitor electrode 460 may cover surfaces (e.g., upper and lower surfaces) and both sidewalls in the third direction D3 of the connecting pattern 127 as well as the upper and lower surfaces and both outer sidewalls in the third direction D3 of the dielectric pattern 440. Accordingly, the second capacitor electrode 460 may contact the connection pattern 127 so that the second capacitor electrode 460 may be electrically connected to the second source/drain layer 490 included in the second transistor that contacts the connection pattern 127. Alternatively, the second capacitor electrode 460 may not be in contact with the second source/drain layer 490 included in the first transistor in the second direction D2, so that the second capacitor electrode 460 may not be electrically connected to the second source/drain layer 490.

For example, the first and second capacitor electrodes 380 and 460 may include a conductive material such as, but not limited to, a metal, metal nitride, metal silicide, silicon-germanium (Si—Ge) doped with an impurity, or the like. For example, the dielectric pattern 440 may include a metal oxide having a high dielectric constant such as, but not limited to, hafnium oxide ($HfO_2$), zirconium oxide ($ZrO_2$), or a ferroelectric.

For example, the channel 125 may include a semiconductor material such as silicon (Si), germanium (Ge), silicon-germanium (Si—Ge), or the like. Alternatively or additionally, for example, the channel 125 may include an oxide semiconductor material such as, but not limited to, zinc tin oxide (ZTO), indium zinc oxide (IZO), zinc oxide ($ZnO_x$), indium gallium zinc oxide (IGZO), indium gallium silicon oxide (IGSO), indium oxide ($InO_x$ or $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), or the like.

Each of the first and second source/drain layers 520 and 490 may include a substantially similar and/or the same material as the material of the channel 125, however, the material of the first and second source/drain layers 520 and 490 may be doped with an n-type and/or a p-type impurity. For example, the first and second source/drain layers 520 and 490 may include an impurity having the same conductivity type.

In an embodiment, the gate structure 230 may include a gate insulating pattern 210 covering surfaces (e.g., upper and lower surfaces) and both sidewalls in the third direction D3 of the channel 125, and a gate electrode 220 covering surfaces (e.g., upper and lower surfaces) and both outer sidewalls in the third direction D3 of the gate insulating pattern 210. Accordingly, the channel 125 may penetrate the gate structure 230 in the second direction D2, and the gate structure 230 may have a gate all around (GAA) structure surrounding the channel 125.

According to an embodiment, the gate structure 230 may have a single-gate or a double-gate structure instead of the GAA structure surrounding the channel 125. That is, instead of a structure in which the gate structure 230 surrounds the channel 125 and the channel 125 penetrates the gate structure 230, the gate structure 230 may have a single-gate structure formed on an upper and/or lower surface of the channel 125, and/or the gate structure 230 may have a double-gate structure formed on each of upper and lower surfaces of the channel 125. That is, the present disclosure is not limited in this regard, and the gate structure 230 may have various known structures.

In an embodiment, a plurality of channels 125 disposed along the third direction D3 and gate electrodes 220 surrounding gate insulating patterns 210 covering the plurality of channels 125 and disposed adjacent to each other in the third direction D3 may be connected to each other in the same layer, so that one word line WL extending in the third direction D3 is formed above the first and second regions I and II of the substrate 100. Therefore, a portion surrounding the channel 125 in the word line WL may be defined as the gate electrode 220.

Additionally, the word lines WL that are spaced apart from each other in the second direction D2 to extend in the third direction D3 in the same layer may extend in the second direction D2 above the second region II of the substrate 100 to be connected to each other. In an embodiment, the word lines WL connected to each other may be integrally formed.

Hereinafter, portions extending in the third direction D3 from one word line WL integrally connected to each other in the same layer may be referred to as a first extension portion 222, and a portion extending in the second direction D2 to contact the first extension portion 222 may be referred to as a second extension portion 224.

In an embodiment, two (2) gate electrodes 220 formed in the same layer to be formed on both sides of the capacitor 470 in the second direction D2 may be electrically connected to the same word line WL, and a plurality of gate electrodes 220 formed in the same layer to be spaced apart from each other in the third direction D3 may also be electrically connected to the same word line WL.

In an embodiment, second extension portions 224 of the word line WL may be disposed in stairs along the third direction D3 above the second region II of the substrate 100.

In an embodiment, lengths of first extension portions 222 of the word line WL along the third direction D3 that are respectively connected to the second extension portions 224 of the word line WL, may increase stepwise from an upper layer thereof to a lower layer thereof.

In another embodiment, the lengths of the first extension portions 222 of the word line WL along the third direction D3 that are respectively connected to the second extension portions 224 of the word line WL, may decrease stepwise from an upper layer thereof to a lower layer thereof.

In another embodiment, the lengths of the first extension portions 222 of the word line WL along the third direction D3 that are respectively connected to the second extension portions 224 of the word line WL, may increase and then may decrease stepwise from an upper layer thereof to a lower layer thereof or may decrease and then may increase stepwise from the upper layer thereof to the lower layer thereof.

For example, the gate electrode 220 may include a conducting material such as, but not limited to, a metal, a metal nitride, a metal silicide, or the like, and the gate insulating pattern 210 may include an oxide such as, but not limited to, silicon oxide ($SiO_2$), a metal oxide, or the like.

The contact plug 600 may be disposed below the second extension portion 224 of the word line WL above the second region II of the substrate 100 to contact it. In an embodiment, one or more contact plugs 600 may be disposed below the second extension portion 224 of each word line WL, and the contact plug 600 may be disposed in various layouts.

In the drawings, for example, the contact plugs 600 are depicted as being disposed near a portion where the first and second extension portions 222 and 224 of each of the word lines WL meet each other, and disposed in a zigzag pattern when viewed from above, however, the present disclosure is not limited thereto. For example, each contact plug 600 may be disposed at a central portion of the second extension portion 224 of each word line WL, and may also be disposed in a zigzag pattern when viewed from above. In an embodiment, the contact plug 600 may include a conducting material such as a metal, a metal nitride, a metal silicide, or the like.

In the semiconductor device, the gate electrode 220, the channel 125, and the first and second source/drain layers 520 and 490 may form first and second transistors. In an embodiment, the first source/drain layer 520 of the first transistor may be electrically connected to the bit line BL 532, the second source/drain layer 490 of the first transistor may be electrically connected to the first capacitor electrode 380 included in the capacitor 470, the first source/drain layer 520 of the second transistor may be electrically connected to the complementary bit line BLB 534, and the second source/drain layer 490 of the second transistor may be electrically connected to the second capacitor electrode 460 included in the capacitor 470 through the connection pattern 127. Additionally, each of the gate electrodes 220 included in the first and second transistors may be electrically connected to the same word line WL.

Accordingly, each memory cell of the semiconductor device may have a 2T-1C structure including the first and second transistors and the capacitor 470 formed between them.

Additionally, if the semiconductor device has the COP structure or the POC structure, the bit line sense amplifier BLSA may be formed below or above the bit lines BL 532 and the complementary bit lines BLB 534. Because the bit lines BL 532 and the complementary bit lines BLB 534 are formed at the same layer, a distance between the bit line sense amplifier BLSA and the bit lines BL 532 and a distance between the bit line sense amplifier BLSA and the complementary bit lines BLB 534 may be substantially similar and/or the same. That is, for example, if the bit lines BL 532 and the complementary bit lines BLB 534 horizontally extend from different layers, distances between the bit line sense amplifiers BLSA disposed below or above them and the bit lines BL 532 and the complementary bit lines BLB

534 may be not the same so that a signal delay problem may occur. However, because the bit lines BL 532 and the complementary bit lines BLB 534 extend to the same length in a vertical direction at the same layer, separation distances between the bit line sense amplifier BLSA and the bit lines BL 532 and separation distances between the bit line sense amplifier BLSA and the complementary bit lines BLB 534 may be substantially similar and/or the same, so that a signal delay problem may be prevented or reduced.

Referring to FIG. 2, in an embodiment, the peripheral circuit portion PC including the bit line sense amplifier BLSA and the sub-word line driver SWD may be disposed below the memory cell array portion MA.

Referring to FIG. 7, the peripheral circuit portion PC may include a plurality of bit line sense amplifiers BLSA, the bit line connection line BLC, and the complementary bit line connection line BLBC that are disposed at a position overlapping the first region I of the substrate 100 in the first direction D1. The peripheral circuit portion PC may include a plurality of sub-word line drivers SWD disposed at a position that overlaps the second region II of the substrate 100 in the first direction.

The bit line connection line BLC and the complementary bit line connection line BLBC may extend in the second direction D2, and may be connected to the bit line sense amplifier BLSA overlapping the bit line connection line BLC and the complementary bit line connection line BLBC. One bit line sense amplifier BLSA and the bit line connection line BLC and the complementary bit line connection line BLBC connected to the one bit line sense amplifier BLSA may be referred to as sense amplifier sharing rows (e.g., a first sense amplifier sharing row R1, a second sense amplifier sharing row R2, and a third sense amplifier sharing row R3).

The bit line connection line BLC of each of the first to third sense amplifier sharing rows R1 to R3 may be connected to the plurality of bit lines BL (e.g., first bit lines BL1, second bit lines BL2, and third bit lines BL3) overlapping the bit line connection line BLC, and the complementary bit line connection line BLBC of each of the first to third sense amplifier sharing rows R1 to R3 may be connected to the plurality of complementary bit lines BLB (e.g., first complementary bit lines BLB1, second complementary bit lines BLB2, and third complementary bit lines BLB3) overlapping the complementary bit line connection line BLBC. That is, the bit line connection line BLC and the complementary bit line connection line BLBC of the first sense amplifier sharing row R1 may be electrically connected by contacting the first bit lines BL1 and the first complementary bit lines BLB1 of a first row, respectively. The bit line connection line BLC and the complementary bit line connection line BLBC of the second sense amplifier sharing row R2 may be electrically connected by contacting the second bit lines BL2 and the second complementary bit lines BLB2 of a second row, respectively. The bit line connection line BLC and the complementary bit line connection line BLBC of the third sense amplifier sharing row R3 may be electrically connected by contacting the third bit lines BL3 and the third complementary bit lines BLB3 of a third row, respectively. As a result, the plurality of bit lines BL1 to BL3 that overlap each sense amplifier sharing row R1 to R3, and the plurality of complementary bit lines BLB1 to BLB3 may share the same bit line sense amplifier BLSA. That is, the bit line pairs included in the plurality of sub-cell arrays SCA1 to SCA3 may share one bit line sense amplifier BLSA, so that the number of bit line sense amplifiers BLSA is reduced.

In FIG. 7, three (3) sense amplifier sharing rows R1, R2, and R3 are illustrated, but according to an embodiment, four (4) or more sense amplifier sharing rows may be included. In addition, three (3) bit line pairs sharing one bit line sense amplifier BLSA are illustrated, but according to an embodiment, there may be two (2) or four (4) or more bit line pairs sharing the one bit line sense amplifier BLSA.

The plurality of sub-word line drivers SWD corresponding to the plurality of word lines WL may be disposed in the second direction D2. One sub-word line driver SWD may be disposed at each word line WL.

Figure 8:
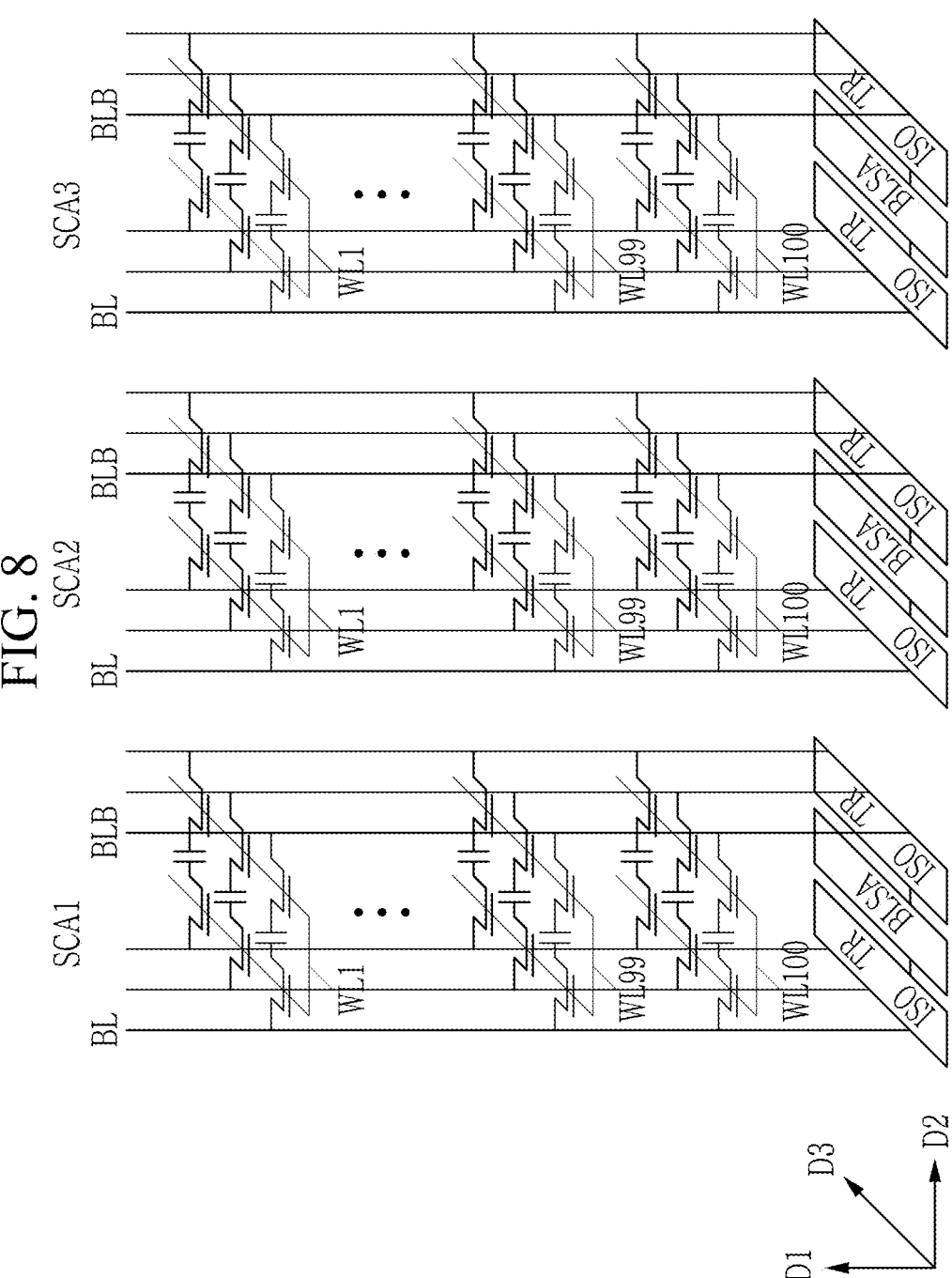
FIG. 8 is an equivalent circuit showing a cell array of a semiconductor device, according to an embodiment.
Figure 9:
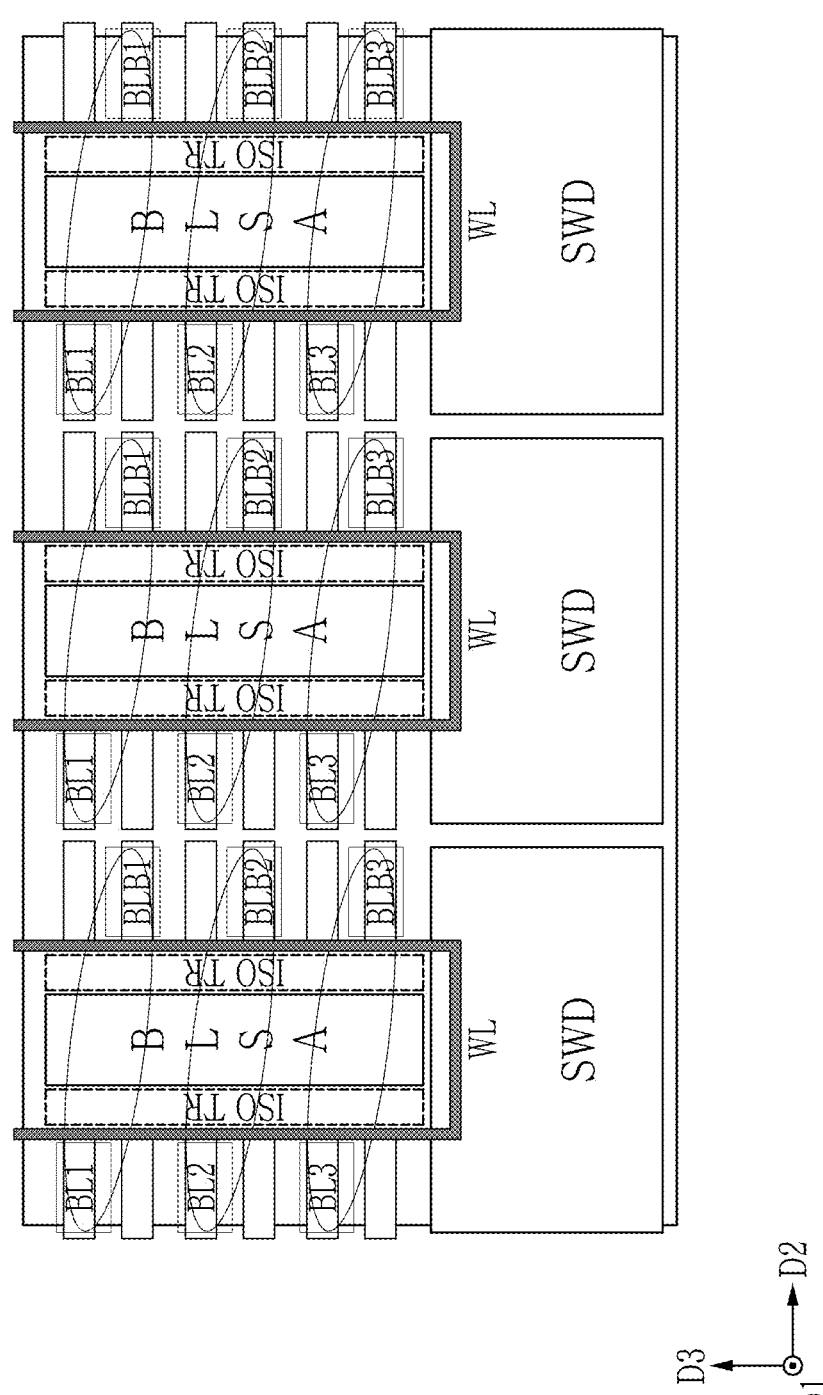
FIG. 9 is a disposition view of a peripheral circuit portion of the semiconductor device of FIG. 8, according to the embodiment.

FIG. 8 is an equivalent circuit showing a cell array of a semiconductor device, according to an embodiment. FIG. 9 is a disposition view of a peripheral circuit portion of the semiconductor device, according to the embodiment of FIG. 8.

Referring to FIG. 8, a circuit configuration of a memory cell array portion MA of the semiconductor device according to the other embodiment may be the same as that of the embodiment of FIG. 1.

In the embodiment of FIG. 8, bit line pairs included in each of the plurality of sub-cell arrays SCA1 to SCA3 may be connected to the same bit line sense amplifier BLSA. That is, the bit line pairs included in the first sub-cell array SCA1 may be connected to one bit line sense amplifier BLSA, the bit line pairs included in the second sub-cell array SCA2 may be connected to the one bit line sense amplifier BLSA, and the bit line pairs included in the third sub-cell array SCA3 may be connected to the one bit line sense amplifier BLSA. According to an embodiment, there may be two (2) or four (4) or more bit line pairs connected to the one bit line sense amplifier BLSA. According to the embodiment, all bit line pairs included in each of the plurality of sub-cell arrays SCA1 to SCA3 may be connected to the one bit line sense amplifier BLSA, and the bit line pairs included in each of the plurality of sub-cell arrays SCA1 to SCA3 may be divided into a plurality of groups, and may be connected to one bit line sense amplifier BLSA for each group.

An isolation transistor ISO TR may be inserted between the bit line sense amplifier BLSA and the plurality of bit lines BL1 to BL3, and between the bit line sense amplifier BLSA and the plurality of complementary bit lines BLB1 to BLB3. The isolation transistor ISO TR may allow for independent driving of the plurality of bit lines BL1 to BL3 and the plurality of complementary bit lines BLB1 to BLB3 that share the bit line sense amplifier BLSA.

Referring to FIG. 9, a peripheral circuit portion PC may include a plurality of bit line sense amplifiers BLSA, a plurality of isolation transistors ISO TR, the bit line connection line BLC, and the complementary bit line connection line BLBC that are disposed at a position overlapping a first region I of the substrate 100 in the first direction D1. The peripheral circuit portion PC may include a plurality of sub-word line drivers SWD disposed at a position that overlaps a second region II of the substrate 100 in the first direction D1. Some of the isolation transistors ISO TR may be inserted (disposed) between the bit line sense amplifier BLSA and the plurality of bit lines BL1 to BL3 connected to bit line sense amplifier BLSA to serve as a switch for selectively connecting one of the plurality of bit lines BL1 to BL3 to the bit line sense amplifier BLSA and blocking the rest of the plurality of bit lines BL1 to BL3. Other isolation transistors ISO TR may be inserted between the bit line sense amplifier BLSA and the plurality of complementary bit lines BLB1 to BLB3 connected to the bit line sense amplifier BLSA to serve as a switch for selectively connecting one of the plurality of complementary bit lines BLB1 to BLB3 to the bit line sense amplifier BLSA and blocking the rest of the plurality of complementary bit lines BLB1 to BLB3. Accordingly, a plurality of bit line pairs may share one bit line sense amplifier BLSA. That is, the plurality of bit line pairs included in each of the plurality of sub-cell arrays SCA1 to SCA3 may share the one bit line sense amplifier BLSA, so that the number of bit line sense amplifiers BLSA may be reduced.

Each of the plurality of sub-word line drivers SWD may be disposed to correspond to each of the plurality of sub-cell arrays SCA1 to SCA3. The plurality of sub-word line drivers SWD may apply word line signals to word lines WL disposed at each of the plurality of sub-cell arrays SCA1 to SCA3.

Figure 10:
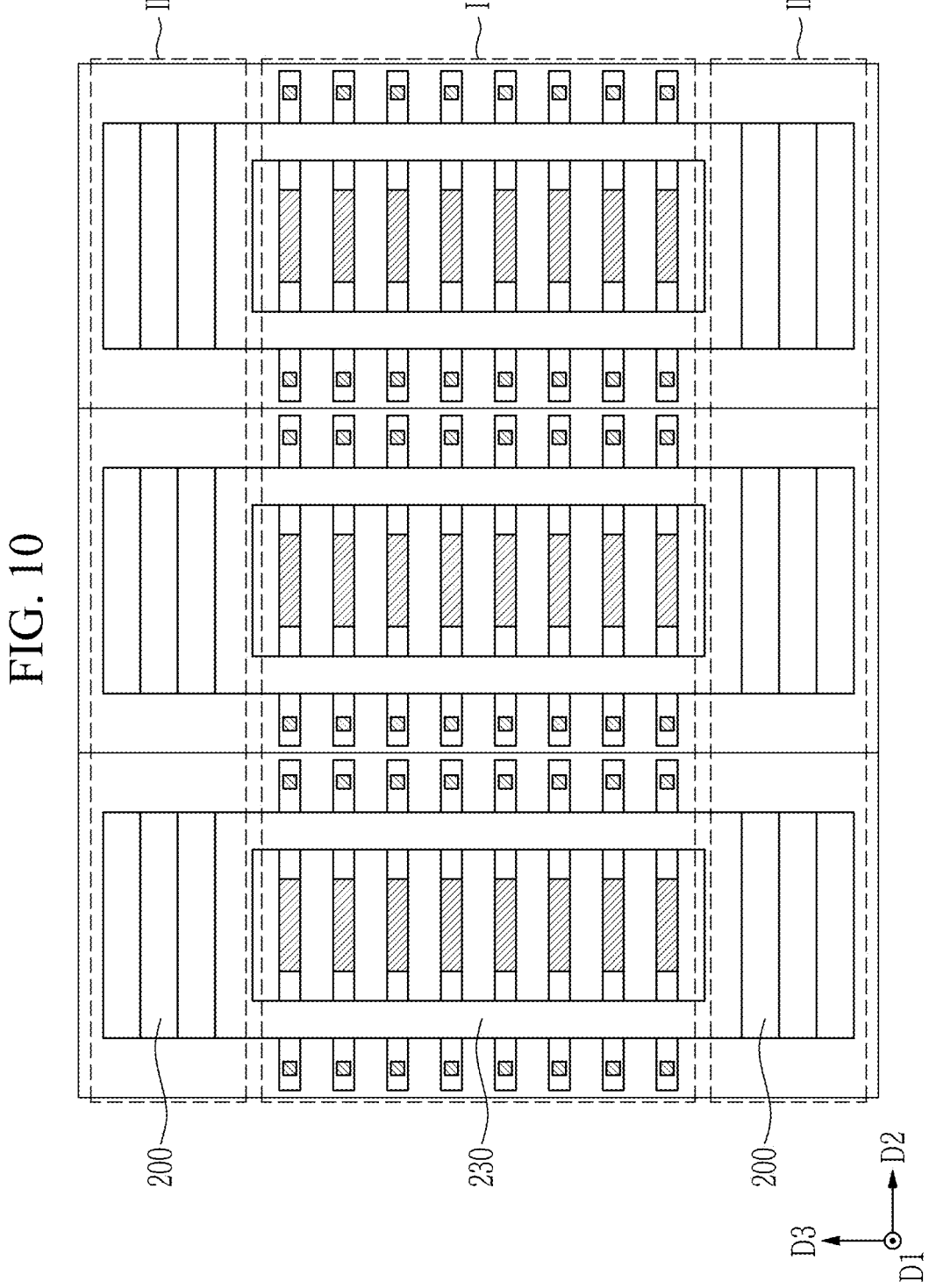
FIG. 10 is an upper side view of a semiconductor device, according to an embodiment.
Figure 11:
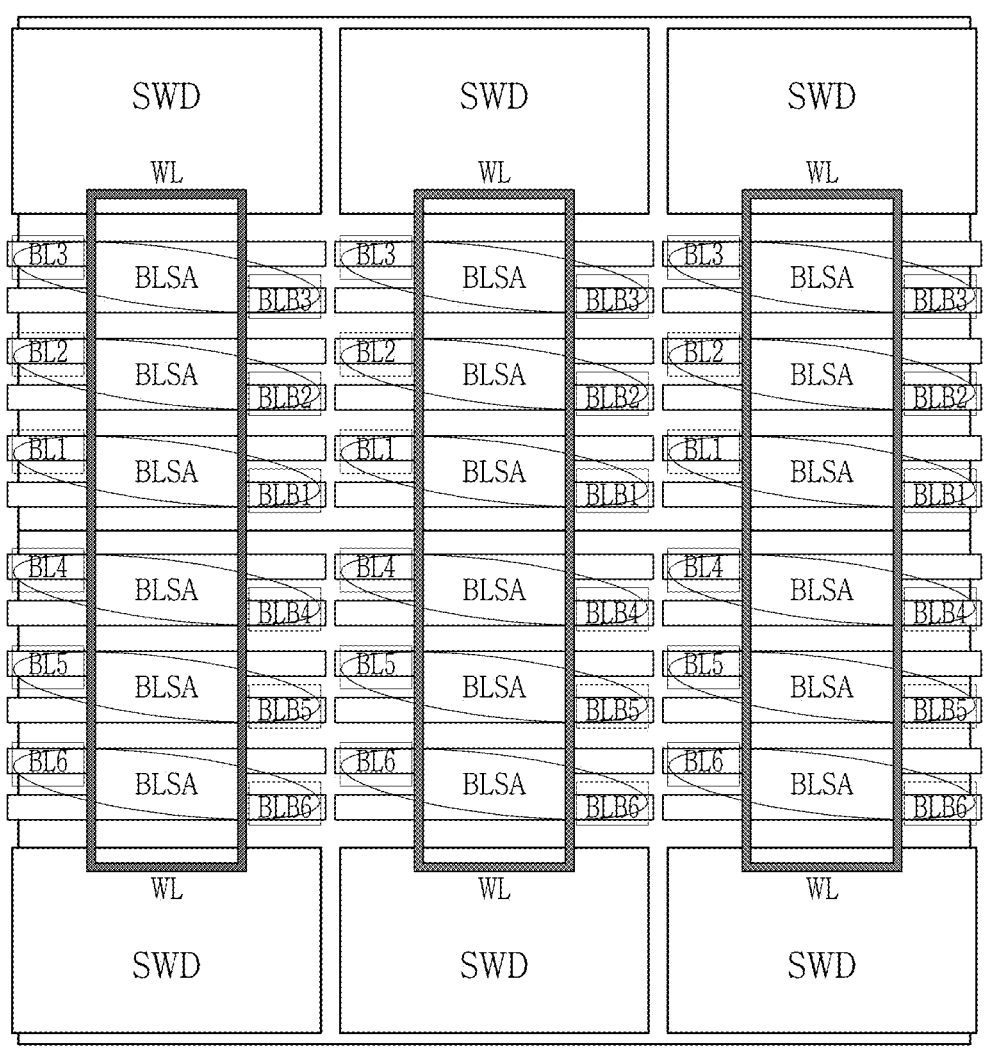
FIGS. 11 to 13 are disposition views of peripheral circuit portions of semiconductor devices, according to embodiments.
Figure 11:
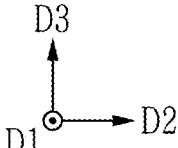
Figure 12:
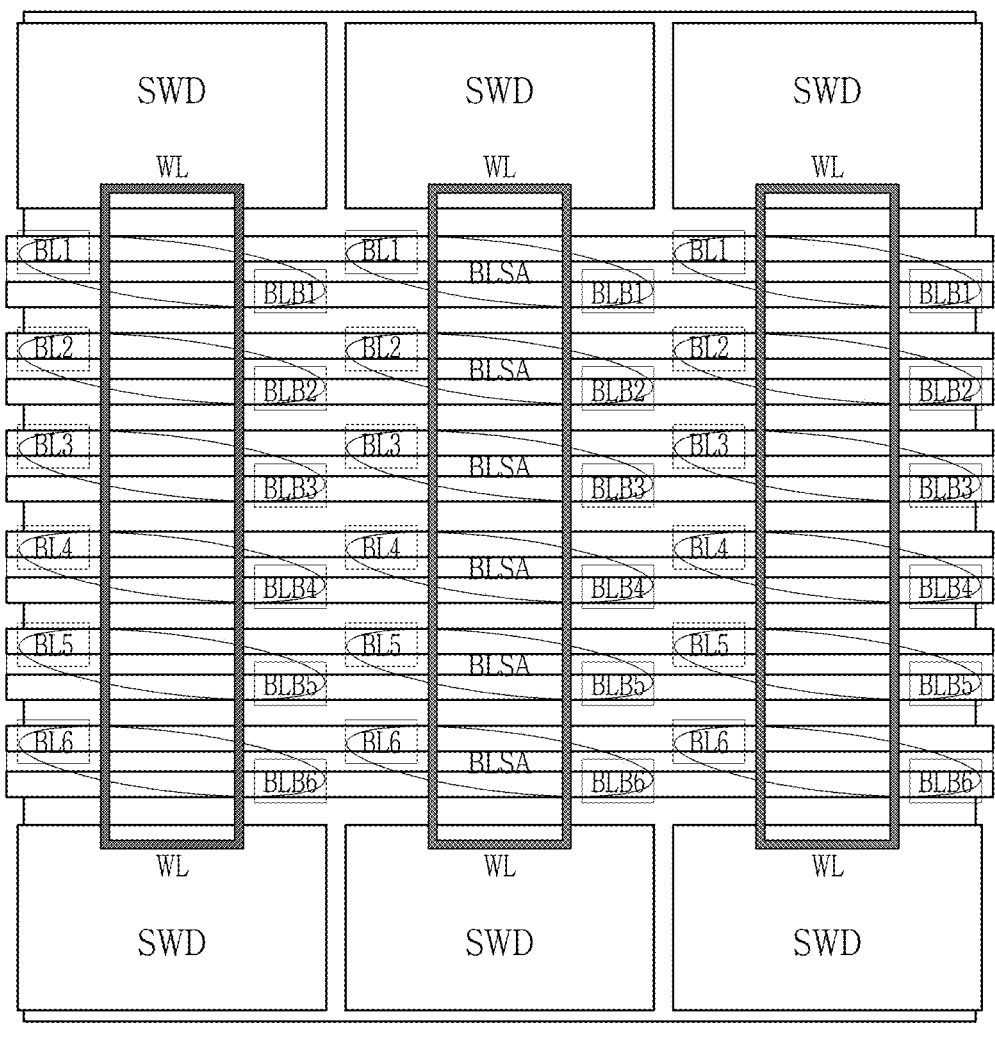
Figure 12:
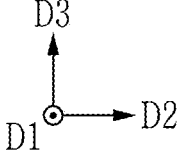
Figure 13:
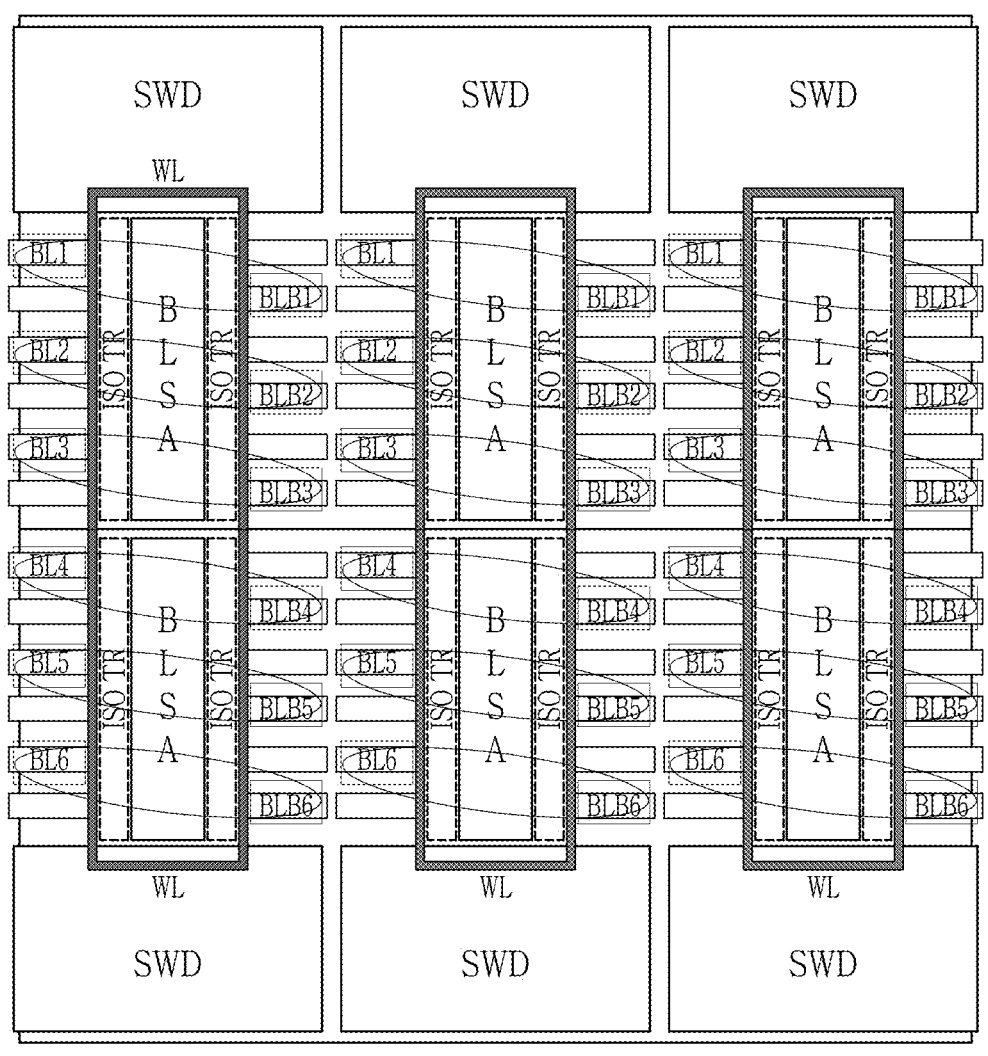
Figure 13:
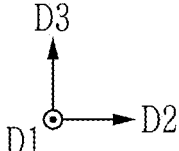

FIG. 10 is an upper side view of a semiconductor device, according to another embodiment. FIGS. 11 to 13 are disposition views of peripheral circuit portions of semiconductor devices, according to other embodiments.

Referring to FIG. 10 and FIG. 11, a memory cell array portion MA of the semiconductor device, according to the embodiment, may include the first region I and a second region II disposed at both sides of the first region I. That is, an extension portion 200 of the word line WL including a word line pad for connecting contact plugs may be disposed at both sides of a cell region where the memory cells are formed.

A peripheral circuit portion PC of the semiconductor device, according to the embodiment, may include a plurality of bit line sense amplifiers BLSA that may be disposed at a position overlapping the first region I of the substrate 100 in the first direction D1, and may include a plurality of sub-word line drivers SWD disposed at a position overlapping the second region II in the first direction D1.

If the sub-word line drivers SWD are disposed at both sides of the cell region, a delay of a word line signal caused by an increased distance between the sub-word line driver SWD and the word line WL may be reduced.

Referring to FIG. 12, the sub-word line drivers SWD may be disposed at both sides of the cell region, and bit line pairs included in the plurality of sub-cell arrays SCA1 to SCA3 may be connected to the same bit line sense amplifier BLSA. That is, one bit line pair included in the first sub-cell array SCA1, one bit line pair included in the second sub-cell array SCA2, and one bit line pair included in the third sub-cell array SCA3 may share one bit line sense amplifier BLSA.

Referring to FIG. 13, the sub-word line drivers SWD may be disposed at both sides of the cell region, and bit line pairs included in each of the plurality of sub-cell arrays SCA1 to SCA3 may be divided into a plurality of groups so that the bit line pairs belonging to each group are connected to the same bit line sense amplifier BLSA. In FIG. 13, the bit line pairs included in each of the plurality of sub-cell arrays SCA1 to SCA3 are divided into two (2) groups so that the two (2) groups are connected to one bit line sense amplifier BLSA. However, according to an embodiment, all bit line pairs included in each of the plurality of sub-cell arrays SCA1 to SCA3 may be connected to the one bit line sense amplifier BLSA. According to an embodiment, the bit line pairs included in each of the plurality of sub-cell arrays SCA1 to SCA3 may be divided into three (3) or more groups so that each group is connected to a separate bit line sense amplifier BLSA.

FIGS. 14, 16, 18, 20, and 22 are perspective views of word line pad portions of semiconductor devices, according to other embodiments. FIGS. 15, 17, 19, 21, and 23 are front views of the word line pad portions of the semiconductor devices of FIGS. 14, 16, 18, 20, and 22.

Figure 14:
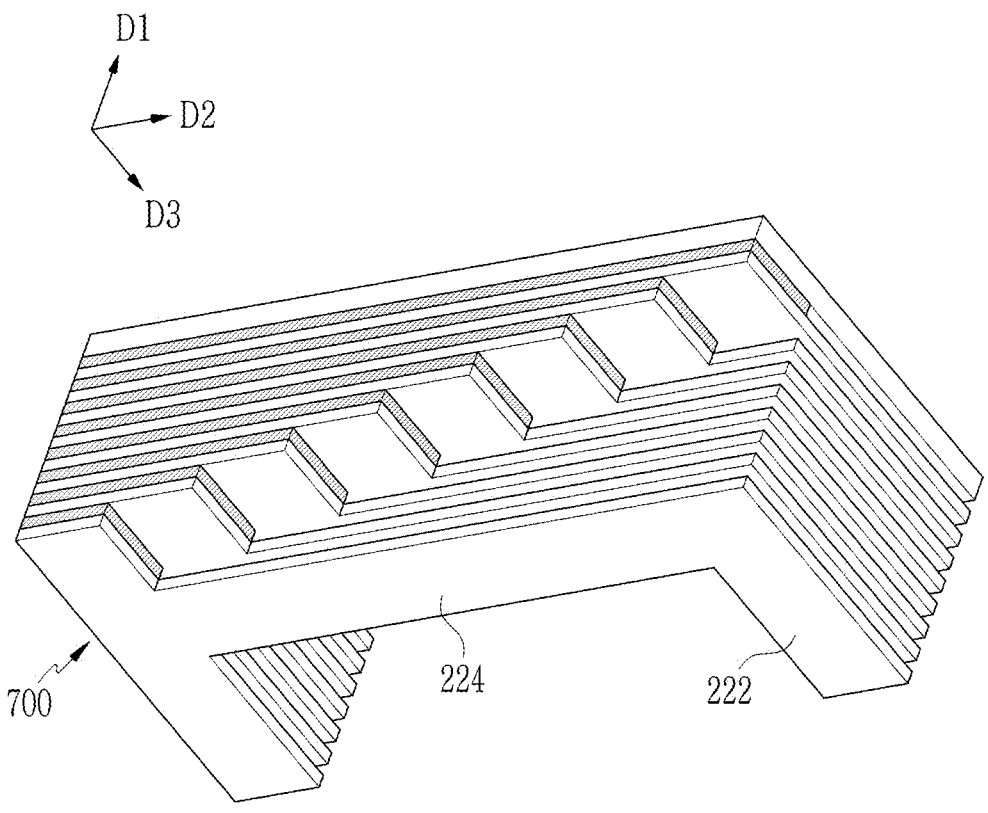
FIGS. 14, 16, 18, 20, and 22 are perspective views of word line pad portions of semiconductor devices, according to embodiments.
Figure 15:
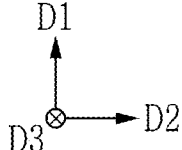
FIGS. 15, 17, 19, 21, and 23 are front views of the word line pad portions of the semiconductor devices of FIGS. 14, 16, 18, 20, and 22, according to an embodiment.
Figure 15:
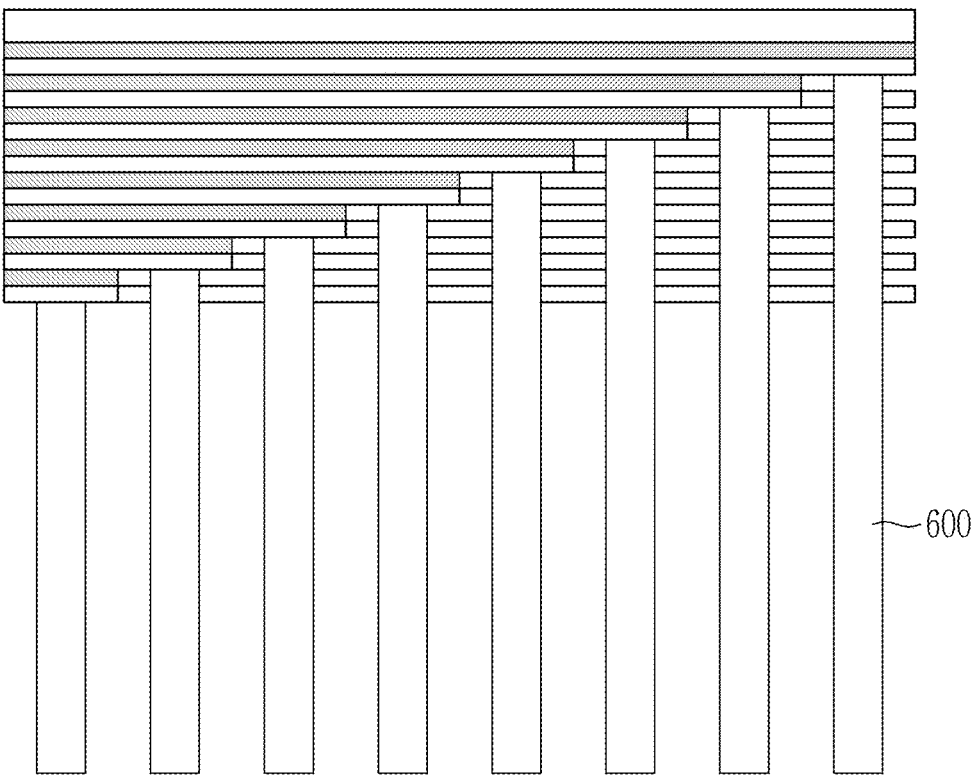

Referring to FIG. 14 and FIG. 15, the semiconductor device, according to the embodiment may include a plurality of word lines WL stacked in the first direction D1. The plurality of word lines WL may include a pad portion 700 for connecting the word lines WL to a sub-word line driver SWD, and may be connected to the sub-word line driver SWD through a contact plug 600 disposed at the pad portion 700. The pad portion 700 may have a stair shape, which may allow for a separate contact plug 600 to contact word lines WL including a plurality of layers. The pad portion 700 may be and/or may include an end of a first extension portion 222 of the word line extending in the second direction D2 or a portion extending from a second extension portion 224 of the word line WL in the third direction D3. The pad portion 700 may form stairs that go up or down (e.g., extend) along the second direction D2. The stairs of the pad portion 700 may form one step for each word line layer.

If the pad portion 700 of the word line WL is formed as the stairs, a substrate area occupied by the pad portion 700 may be reduced so that the number of memory cells may be increased.

Figure 16:
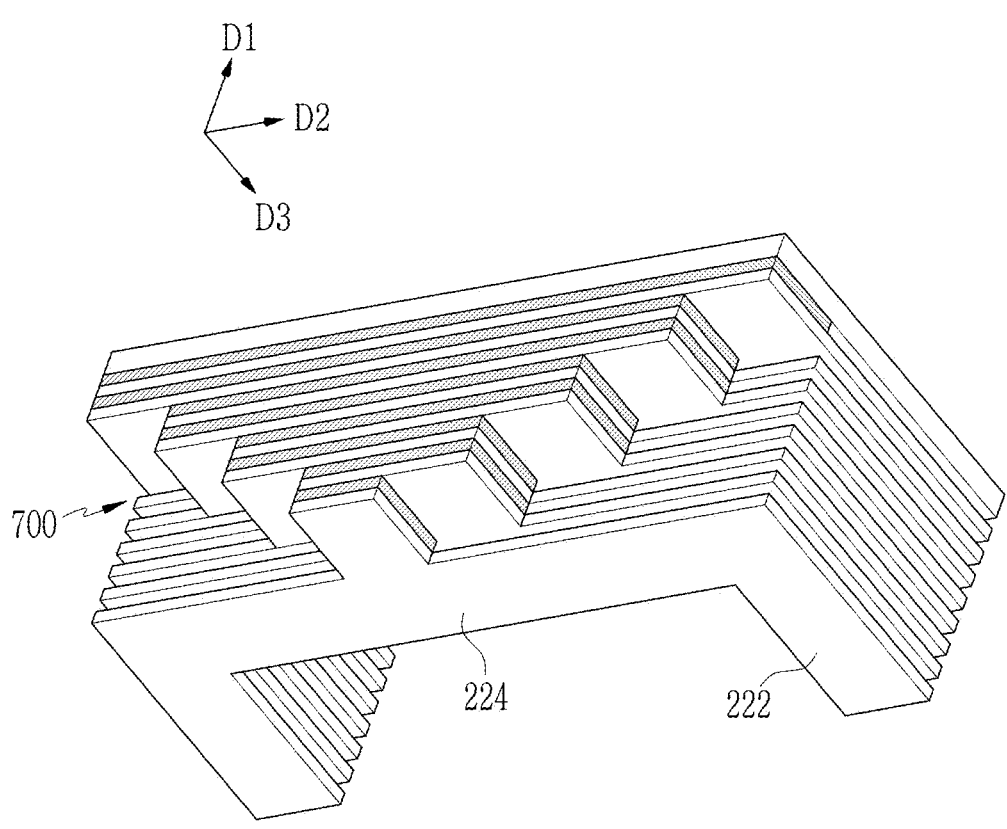
Figure 17:
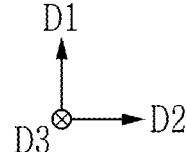
Figure 17:
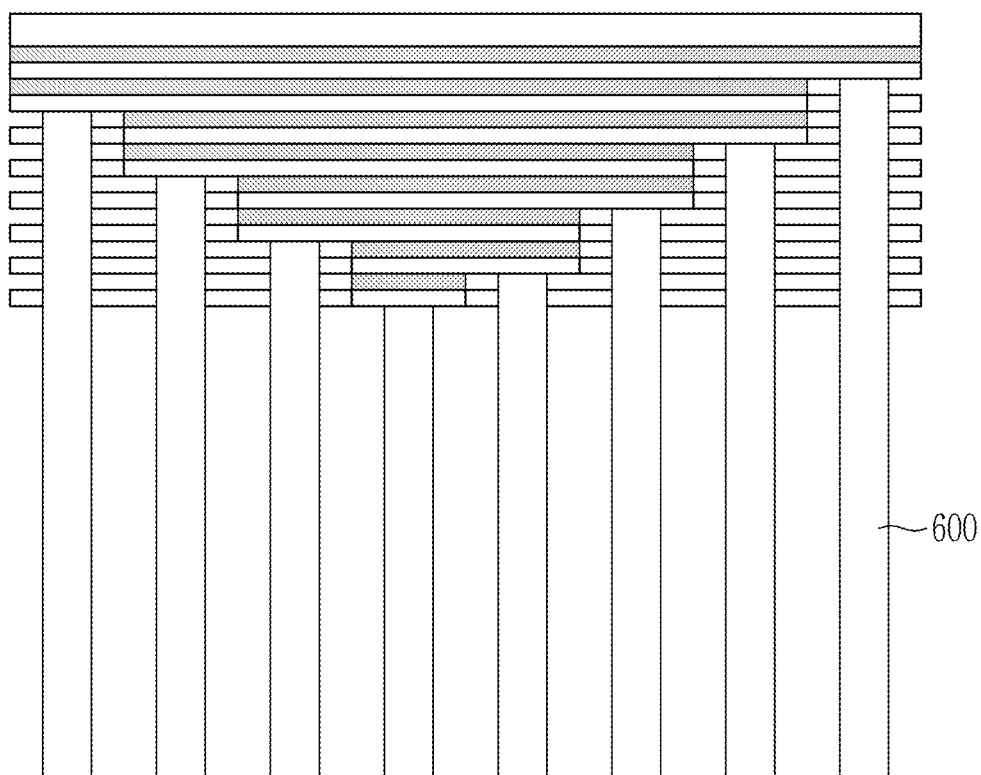

Referring to FIG. 16 and FIG. 17, the semiconductor device, according to the embodiment, may include a plurality of word lines WL stacked in the first direction D1. The plurality of word lines WL may include a pad portion 700 for connecting the word lines WL to a sub-word line driver SWD, and may be connected to the sub-word line driver SWD through a contact plug 600 disposed at the pad portion 700. The pad portion 700 may have a bidirectional stair shape, which may allow for a separate contact plug 600 to contact word lines WL including a plurality of layers. The pad portion 700 may be and/or may include an end of a first extension portion 222 of the word line WL extending in the second direction D2 or a portion extending from a second extension portion 224 of the word line WL in the third direction D3. The pad portion 700 may include both stairs going up along the second direction D2 and stairs going down along the second direction D2. In the stairs of the pad portion 700, a step disposed at a center in the second direction D2 may be a pad of the word line WL disposed at a downmost side in the first direction D1, and a pad of a word line WL disposed directly above a layer may be formed by alternately disposing one step to the left and right around the step disposed at the center.

Figure 18:
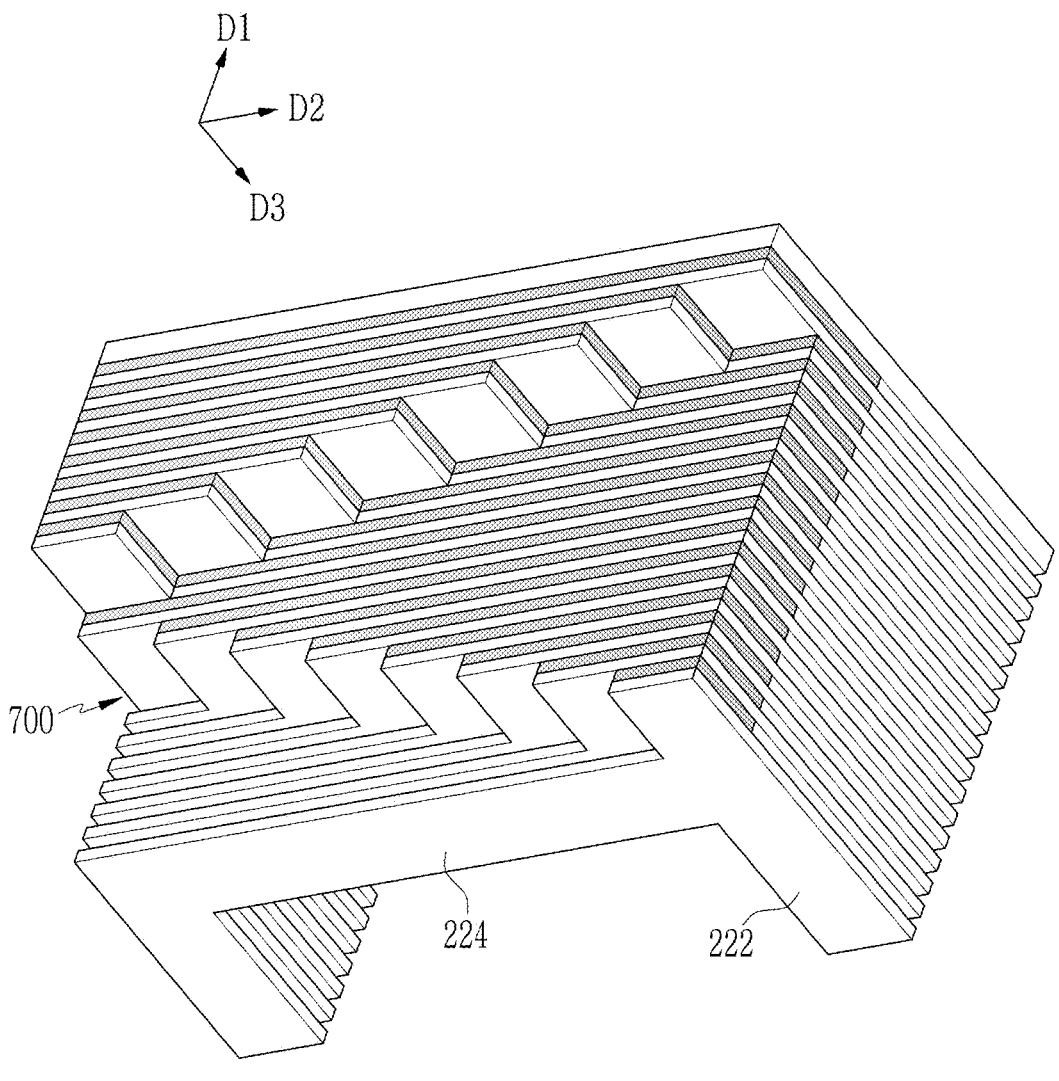
Figure 19:
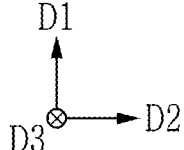
Figure 19:
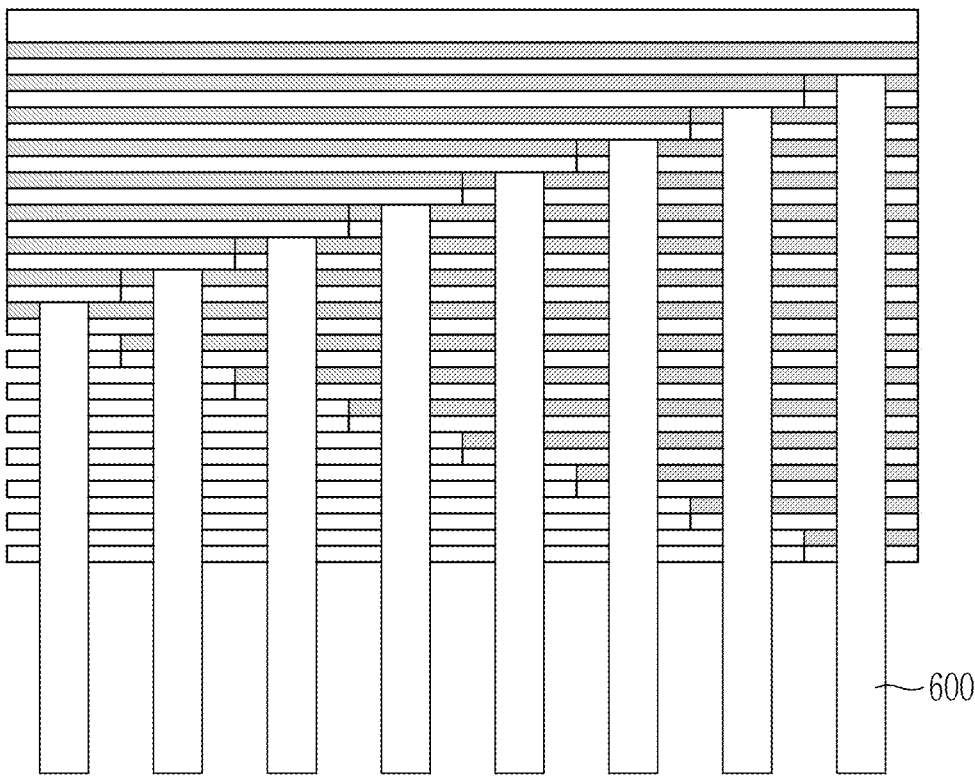

Referring to FIG. 18 and FIG. 19, the semiconductor device, according to the embodiment, may include a plurality of word lines WL stacked in the first direction D1. The plurality of word lines WL may include a pad portion 700 for connecting the word lines WL to a sub-word line driver SWD, and may be connected to the sub-word line driver SWD through a contact plug 600 disposed at the pad portion 700. The pad portion 700 may have a stair shape, which may allow for a separate contact plug 600 to contact word lines WL including a plurality of layers. The pad portion 700 may be and/or an end of a first extension portion 222 of the word line WL extending in the second direction D2 or a portion extending from a second extension portion 224 of the word line WL in the third direction D3. The pad portion 700 may include two (2) stair layers, one of the two (2) stair layers may go up from left to right, and the other of the two (2) stair layers may go up from right to left. That is, the two (2) stair layers may be stairs that go up in a zigzag shape. The stairs of the pad portion 700 may form one step for each word line layer.

Figure 20:
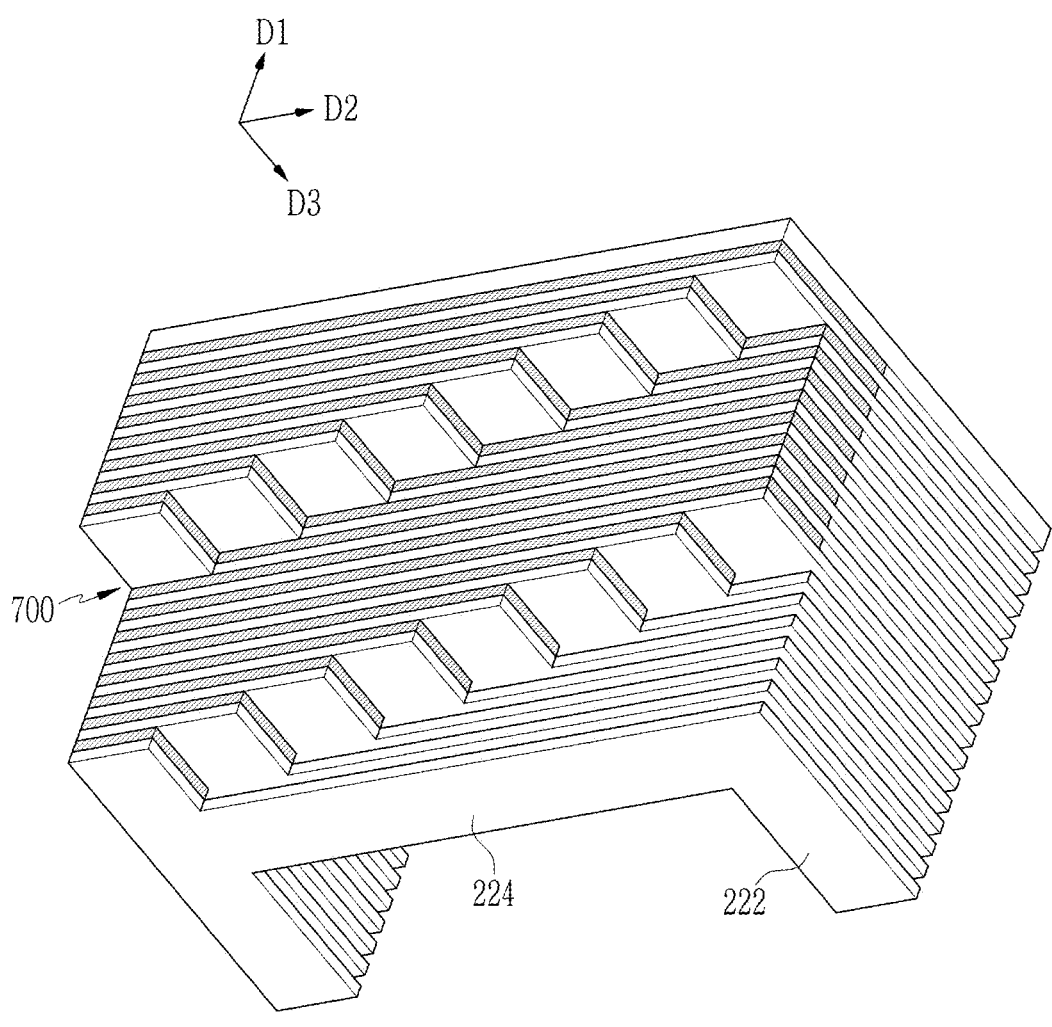
Figure 21:
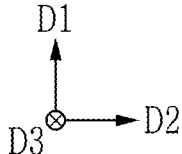
Figure 21:
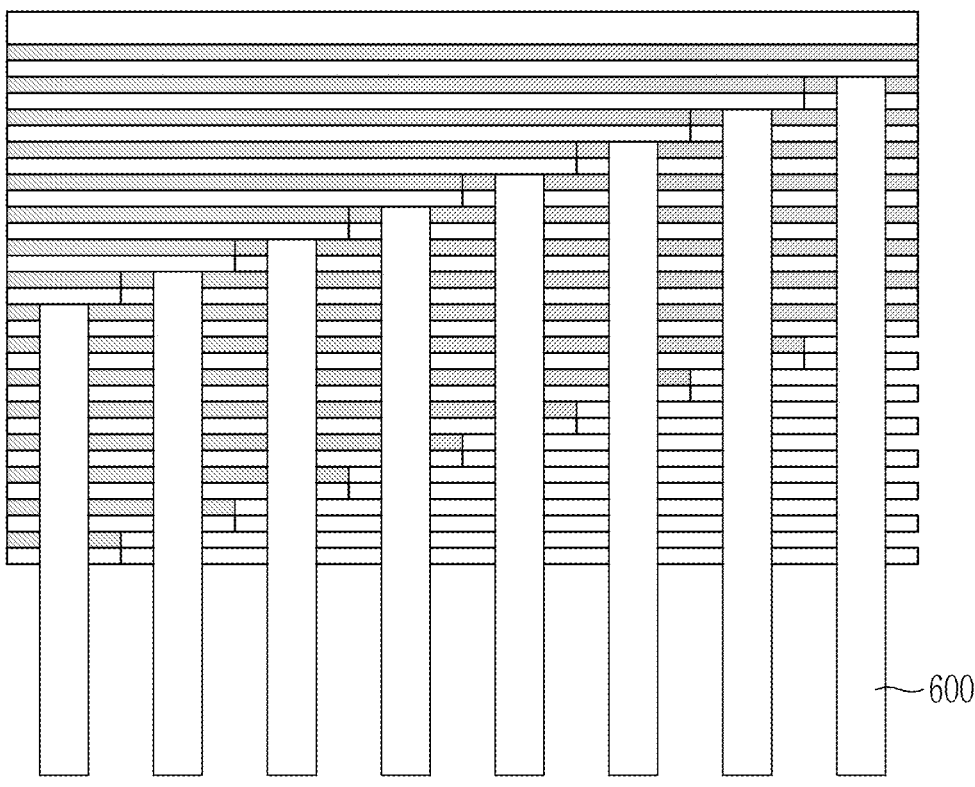

Referring to FIG. 20 and FIG. 21, the semiconductor device, according to the embodiment, may include a plurality of word lines WL stacked in the first direction D1. The plurality of word lines WL may include a pad portion 700 for connecting the word lines WL to a sub-word line driver SWD, and may be connected to the sub-word line driver SWD through a contact plug 600 disposed at the pad portion 700. The pad portion 700 may have a stair shape, which may allow for a separate contact plug 600 to contact word lines WL including a plurality of layers. The pad portion 700 may be and/or may include an end of a first extension portion 222 of the word line WL extending in the second direction D2 or a portion extending from a second extension portion 224 of the word line in the third direction D3. The pad portion 700 may include two (2) stair layers, and both two (2) stair layers may go up or down from left to right. That is, ascending directions of the two (2) stair layers may be the same. Stairs of the pad portion 700 may form one step for each word line layer.

Figure 22:
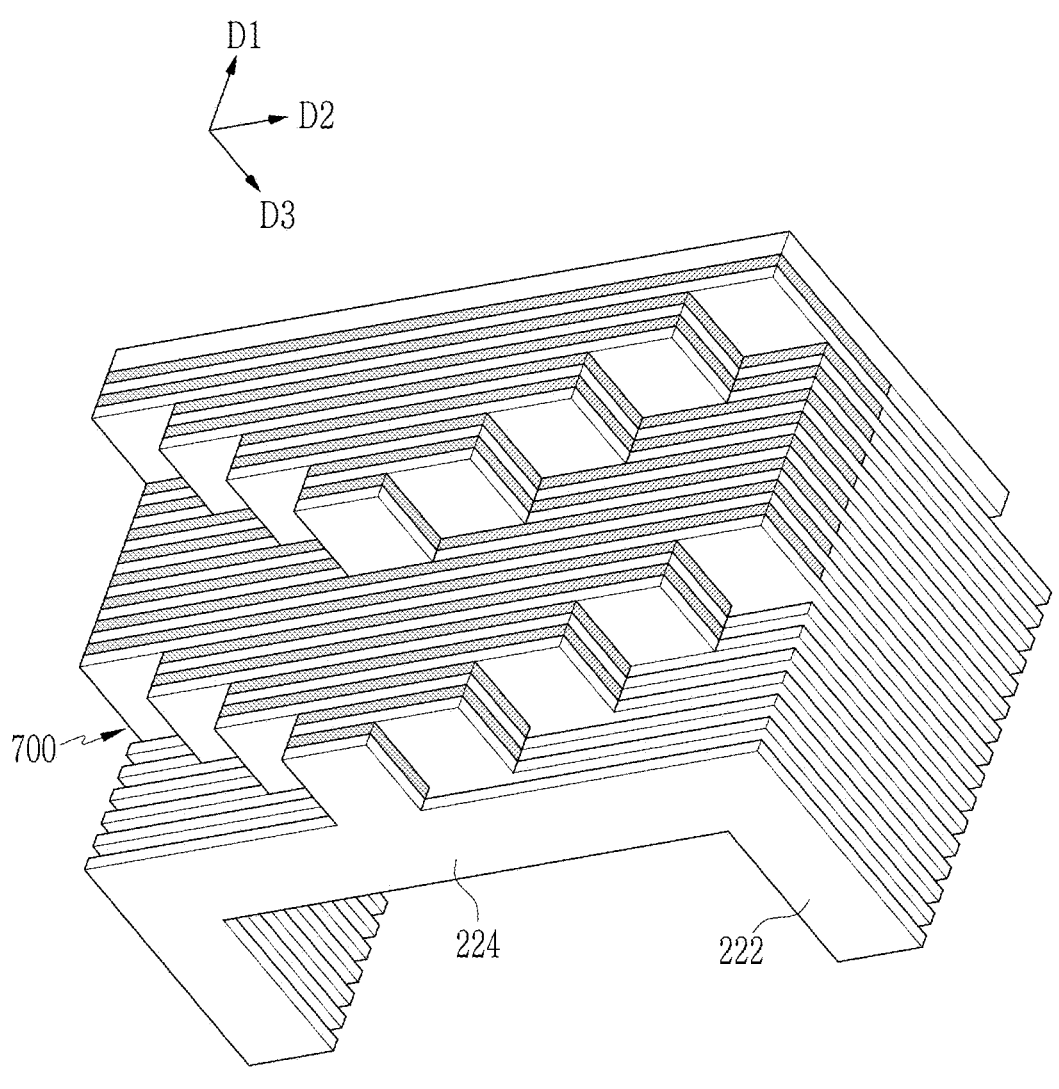
Figure 23:
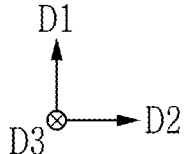
Figure 23:
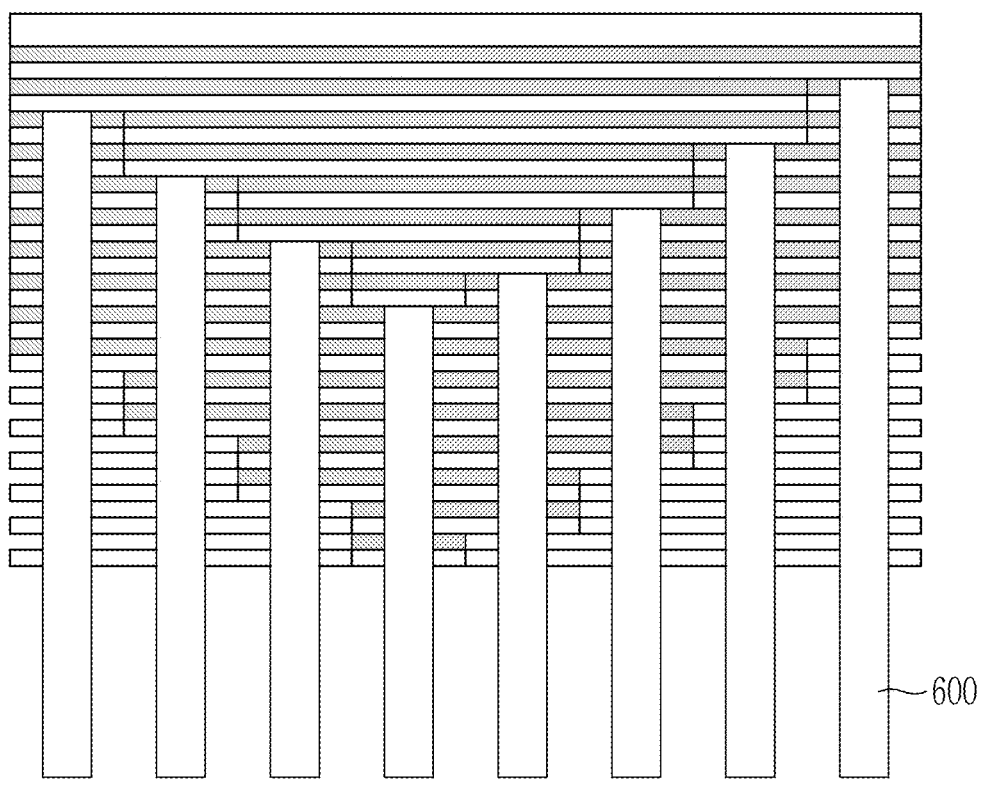

Referring to FIG. 22 and FIG. 23, the semiconductor device, according to the embodiment, may include a plurality of word lines WL stacked in the first direction D1. The plurality of word lines WL may include a pad portion 700 for connecting the word lines WL to a sub-word line driver SWD, and may be connected to the sub-word line driver SWD through a contact plug 600 disposed at the pad portion 700. The pad portion 700 may have a stair shape, which may allow for a separate contact plug 600 to contact word lines WL including a plurality of layers. The pad portion 700 may be and/or may include an end of a first extension portion 222 of the word line WL extending in the second direction D2 or a portion extending from a second extension portion 224 of the word line WL in the third direction D3. The pad portion 700 may include two (2) stair layers, and each stair layer may include both an ascending stair and a descending stair. In each of the two (2) stair layers, a step disposed at a center in the second direction D2 may be a pad of the word line WL disposed at a downmost side in the first direction D1, and a pad of a word line WL disposed directly above a layer may be formed by alternately disposing one step to the left and right around the step disposed at the center.

In addition to the embodiments above, stairs of the pad portion 700 may have various structures.

According to the embodiment, the pad portion 700 may be disposed at both ends of the word line WL. This may be applied to the embodiment of FIGS. 10 to 13.

Although the embodiments of the present disclosure have been described above with reference to the accompanying drawings, those of ordinary skill in the art to which the present disclosure pertains may understand that the present disclosure may be implemented in other specific forms without changing a technical idea or an essential feature of the present disclosure. Therefore, it is to be understood that the embodiment described above is exemplary in all respects and is regarded as restrictive.

What is claimed is:

1. A semiconductor device, comprising:
   a memory cell array comprising a plurality of memory cells disposed in a matrix; and
   a peripheral circuit at least partially overlapping the memory cell array in a first direction and comprising a plurality of sense amplifiers and a plurality of word line drivers configured to drive the plurality of memory cells,
   wherein the memory cell array further comprises a plurality of bit line pairs and a plurality of word lines coupled with the plurality of memory cells,
   wherein the plurality of bit line pairs are divided into a plurality of groups, wherein each group of the plurality of groups comprises at least two bit line pairs,
   wherein the at least two bit line pairs comprised in a same group of the plurality of groups are coupled with a same sense amplifier of the plurality of sense amplifiers,
   wherein the memory cell array further comprises a plurality of sub-cell arrays disposed in a second direction orthogonal to the first direction,
   wherein each sub-cell array of the plurality of sub-cell arrays comprises:
      a plurality of bit lines;
      a plurality of complementary bit lines extending in the first direction; and
      at least two word lines extending in a third direction orthogonal to the first direction and the second direction,
   wherein the at least two word lines are stacked in the first direction,
   wherein the plurality of bit lines and the plurality of complementary bit lines form the plurality of bit line pairs, and
   wherein the at least two bit line pairs are distributed in the plurality of sub-cell arrays and are disposed in a row in the second direction.

2. The semiconductor device of claim 1, wherein each memory cell of the plurality of memory cells is coupled between a bit line of the plurality of bit lines and a complementary bit line of the plurality of complementary bit lines in each sub-cell array of the plurality of sub-cell arrays, and
   wherein each memory cell of the plurality of memory cells comprises a first transistor, a capacitor, and a second transistor that are sequentially coupled.

3. The semiconductor device of claim 2, wherein a bit line of the plurality of bit lines and a complementary bit line of the plurality of complementary bit lines forming a bit line pair of the plurality of bit line pairs are spaced apart from each other in the second direction and the third direction.

4. The semiconductor device of claim 3, wherein the peripheral circuit further comprises:
   a bit line connection line coupling the plurality of bit lines of a group of the plurality of groups with a sense amplifier of the plurality of sense amplifiers; and
   a complementary bit line connection line coupling the plurality of complementary bit lines of the group of the plurality of groups with the sense amplifier of the plurality of sense amplifiers.

5. The semiconductor device of claim 1, wherein the peripheral circuit further comprises a first region where the plurality of sense amplifiers is disposed and a second region where the plurality of word line drivers is disposed, and
   wherein the second region is disposed at a first side of the first region and a second side of the first region.

6. The semiconductor device of claim 5, wherein the plurality of word line drivers is coupled with first ends of the plurality of word lines and with second ends of the plurality of word lines.

7. The semiconductor device of claim 1, further comprising:
   a plurality of contact plugs coupling the plurality of word lines with the plurality of word line drivers,
   wherein each word line of the plurality of word lines comprises a pad in contact with a contact plug of the plurality of contact plugs, and
   wherein pads of the plurality of word lines form stairs that extend along the second direction.

8. The semiconductor device of claim 7, wherein the stairs comprise a plurality of stair layers adjacent to each other in the third direction.

9. A semiconductor device, comprising:

a memory cell array comprising a plurality of memory cells disposed in a matrix; and a peripheral circuit at least partially overlapping the memory cell array in a first direction and comprising a plurality of sense amplifiers and a plurality of word line drivers configured to drive the plurality of memory cells, wherein the memory cell array further comprises a plurality of bit line pairs and a plurality of word lines coupled with the plurality of memory cells, wherein the plurality of bit line pairs are divided into a plurality of groups, wherein each group of the plurality of groups comprises at least two bit line pairs, wherein the at least two bit line pairs comprised in a same group of the plurality of groups are coupled with a same sense amplifier of the plurality of sense amplifiers, wherein the memory cell array further comprises a plurality of sub-cell arrays disposed in a second direction orthogonal to the first direction, wherein each sub-cell array of the plurality of sub-cell arrays comprises:

a plurality of bit lines;

a plurality of complementary bit lines extending in the first direction; and at least two word lines extending in a third direction orthogonal to the first direction and the second direction, wherein the at least two word lines are stacked in the first direction, wherein the plurality of bit lines and the plurality of complementary bit lines form the plurality of bit line pairs, and wherein each of the at least two bit line pairs are comprised in a same sub-cell array of the plurality of sub-cell arrays and are disposed in a row in the third direction.

10. The semiconductor device of claim 9, further comprising an isolation transistor disposed between a sense amplifier of the plurality of sense amplifiers and a bit line of the plurality of bit lines and disposed between the sense amplifier and a complementary bit line of the plurality of complementary bit lines.

11. The semiconductor device of claim 10, wherein each memory cell of the plurality of memory cells is coupled between a bit line of the plurality of bit lines and a complementary bit line of the plurality of complementary bit lines in each sub-cell array of the plurality of sub-cell arrays, and wherein each memory cell of the plurality of memory cells comprises a first transistor, a capacitor, and a second transistor that are sequentially coupled.

12. The semiconductor device of claim 10, wherein the peripheral circuit further comprises a first region where the plurality of sense amplifiers is disposed and a second region where the plurality of word line drivers is disposed, and wherein the second region is disposed at a first side of the first region and a second side of the first region.

13. The semiconductor device of claim 12, wherein the plurality of word line drivers is coupled with first ends of the plurality of word lines and with second ends of the plurality of word lines.

14. The semiconductor device of claim 10, further comprising:

a plurality of contact plugs coupling the plurality of word lines with the plurality of word line drivers, wherein each word line of the plurality of word lines comprises a pad in contact with a contact plug of the plurality of contact plugs, and wherein pads of the plurality of word lines form stairs that extend along the second direction.

15. A semiconductor device, comprising:

a memory cell array comprising a plurality of memory cells disposed in a matrix; and a peripheral circuit at least partially overlapping the memory cell array in a first direction and comprising a plurality of sense amplifiers and a plurality of word line drivers configured to drive the plurality of memory cells, wherein the memory cell array further comprises a plurality of bit line pairs and a plurality of word lines coupled with the plurality of memory cells, wherein the plurality of bit line pairs are coupled with the plurality of sense amplifiers, wherein the plurality of word lines are coupled with the plurality of word line drivers, wherein the peripheral circuit further comprises a first region where the plurality of sense amplifiers is disposed and a second region where the plurality of word line drivers is disposed, wherein the second region is disposed at a first side of the first region and at a second side of the first region, wherein the plurality of word line drivers is coupled with first ends of the plurality of word lines and with second ends of the plurality of word lines, and wherein the memory cell array further comprises a plurality of isolation transistors disposed between each bit line of the plurality of bit line pairs and a corresponding sense amplifier of the plurality of sense amplifiers.

16. The semiconductor device of claim 15, wherein the memory cell array further comprises a plurality of sub-cell arrays disposed in a second direction orthogonal to the first direction, wherein each sub-cell array of the plurality of sub-cell arrays comprises:

a plurality of bit lines;

a plurality of complementary bit lines extending in the first direction; and at least two word lines extending in a third direction orthogonal to the first direction and the second direction, wherein the at least two word lines are stacked in the first direction, wherein the semiconductor device further comprises a plurality of contact plugs coupling the plurality of word lines with the plurality of word line drivers, wherein each word line of the plurality of word lines comprises a pad in contact with a contact plug of the plurality of contact plugs, and wherein pads of the plurality of word lines form stairs that extend along the second direction.

17. A semiconductor device, comprising:

a memory cell array comprising a plurality of memory cells disposed in a matrix; and a peripheral circuit at least partially overlapping the memory cell array in a first direction and comprising a plurality of sense amplifiers and a plurality of word line drivers configured to drive the plurality of memory cells, wherein the memory cell array further comprises a plurality of sub-cell arrays disposed in a second direction orthogonal to the first direction, wherein each sub-cell array of the plurality of sub-cell arrays comprises:

a plurality of bit lines;

a plurality of complementary bit lines extending in the first direction;

a plurality of word lines extending in a third direction orthogonal to the first direction and the second direction, the plurality of word lines being stacked in the first direction; and a plurality of contact plugs coupling the plurality of word lines with the plurality of word line drivers, wherein each word line of the plurality of word lines comprises a pad in contact with a contact plug of the plurality of contact plugs, and wherein pads of the plurality of word lines form stairs that extend along the second direction.

18. The semiconductor device of claim 17, wherein the stairs comprise a plurality of stair layers adjacent to each other in the third direction.

\* \* \* \* \*